(12) United States Patent
Hirayama

(10) Patent No.: US 11,604,370 B2
(45) Date of Patent: Mar. 14, 2023

(54) OPTICAL MODULATOR CARRIER ASSEMBLY AND OPTICAL MODULE

(71) Applicant: SUMITOMO ELECTRIC DEVICE INNOVATIONS, INC., Yokohama (JP)

(72) Inventor: Masahiro Hirayama, Yokohama (JP)

(73) Assignee: SUMITOMO ELECTRIC DEVICE INNOVATIONS, INC., Yokohama (JP)

( * ) Notice: Subject to any disclaimer, the term of this patent is extended or adjusted under 35 U.S.C. 154(b) by 371 days.

(21) Appl. No.: 16/847,836

(22) Filed: Apr. 14, 2020

(65) Prior Publication Data

US 2020/0333639 A1    Oct. 22, 2020

(30) Foreign Application Priority Data

Apr. 16, 2019  (JP) .............................. JP2019-077601

(51) Int. Cl.
*G02F 1/015*      (2006.01)
*H01S 5/026*      (2006.01)
*G02B 6/42*       (2006.01)
*H01S 5/00*       (2006.01)

(52) U.S. Cl.
CPC .............. *G02F 1/015* (2013.01); *G02B 6/42* (2013.01); *H01S 5/005* (2013.01); *H01S 5/026* (2013.01); *G02F 1/0155* (2021.01)

(58) Field of Classification Search
CPC . G02F 1/015; G02B 6/42; H01S 5/005; H01S 5/026; H01S 5/0085
See application file for complete search history.

(56) References Cited

U.S. PATENT DOCUMENTS

2004/0202397 A1\* 10/2004 Hatta .................... G02F 1/0121
                                                              385/2
2021/0218473 A1\* 7/2021 Otani .................. H01S 5/02345

FOREIGN PATENT DOCUMENTS

JP      2002-280662 A    9/2002
JP      2003-198035 A    7/2003

\* cited by examiner

*Primary Examiner* — Diane I Lee
*Assistant Examiner* — Nathaniel J Lee
(74) *Attorney, Agent, or Firm* — Oliff PLC

(57) ABSTRACT

An optical modulator carrier assembly includes a optical modulator, a transmission line substrate, a first via, a second via and a wire having an inductor component provided on a second surface of the transmission line substrate, and electrically connecting between the another end of the first via and the another end of the second via. The one end of the first via, the cathode electrode pad, the terminating resistor, the one end of the second via are arranged on the in this order.

9 Claims, 32 Drawing Sheets

OPTICAL MODULATOR CARRIER ASSEMBLY AND OPTICAL MODULE

TECHNICAL FIELD

The present disclosure relates to an optical modulator carrier assembly and optical module.

BACKGROUND

Japanese Unexamined Patent Publication No. 2003-198035 discloses an optical module including a laser diode that inputs a high-frequency signal and outputs an optical signal. In this optical module, a first transmission line and a second transmission line extend on a pair of different planes that are parallel to each other. The laser diode is disposed between the pair of planes on which the first transmission line and the second transmission line extend. One electrode of the laser diode is electrically connected to the first transmission line by a metal block interposed between the one electrode and the first transmission line. The other electrode of the laser diode is located on the second transmission line and is electrically connected to the second transmission line.

Japanese Unexamined Patent Publication No. 2002-280662 discloses a laser module in which a semiconductor integrated light source is mounted on a mounting substrate, the semiconductor integrated light source having a semiconductor laser and a semiconductor electro-absorption (EA) optical modulator disposed on a semiconductor substrate. This laser module is junction-down mounted so as to bring the surface of the laser module into contact with the surface of the mounting substrate. At this time, an EA optical modulator drive electrode and a stud electrode disposed on the surface of the laser module are bonded to an electrode (electrode to which a high-frequency signal input is applied) and a ground electrode disposed on the surface of the mounting substrate, respectively.

SUMMARY

Some optical modules for high-speed optical communication include a semiconductor laser chip having a laser diode and an optical modulator, and a transmission member having a transmission line (for example, a coplanar line) for supplying a modulated signal to the optical modulator. In such an optical module, the semiconductor laser chip and the transmission line are connected to each other by, for example, a wire. However, when the semiconductor laser chip and the transmission line are connected using a wire as described above, a impedance mismatch is likely to occur due to the influence of the inductance component of the wire. When the impedance mismatch occurs, signal reflection and/or transmission loss occurs at a impedance mismatch point, and the transmission characteristics may be degraded accordingly.

Therefore, possible approaches include a method in which a transmission member having a transmission line is opposed to a semiconductor laser chip, and the transmission line and an electrode pad of the semiconductor laser chip are connected to each other via a metal bump. Such a method makes it possible to reduce the inductance component and suppress the impedance mismatch. However, it is difficult to obtain high-frequency characteristics appropriate to recent high-speed and large-capacity optical communication only with such measures. It is therefore an object of the present disclosure to provide an optical modulator carrier assembly and an optical module capable of improving high-frequency characteristics.

An optical modulator carrier assembly according to an aspect of the present disclosure includes a optical modulator, a transmission line substrate, a first via, a second via and a wire having an inductor component provided on a second surface of the transmission line substrate, and electrically connecting between the another end of the first via and the another end of the second via. The one end of the first via, the cathode electrode pad, the terminating resistor, the one end of the second via are arranged on the in this order.

The optical modulator carrier assembly and the optical module according to the aspect of the present disclosure can improve high-frequency characteristics.

DETAILED DESCRIPTION

Description of Embodiment of Present Disclosure

Figure 1:
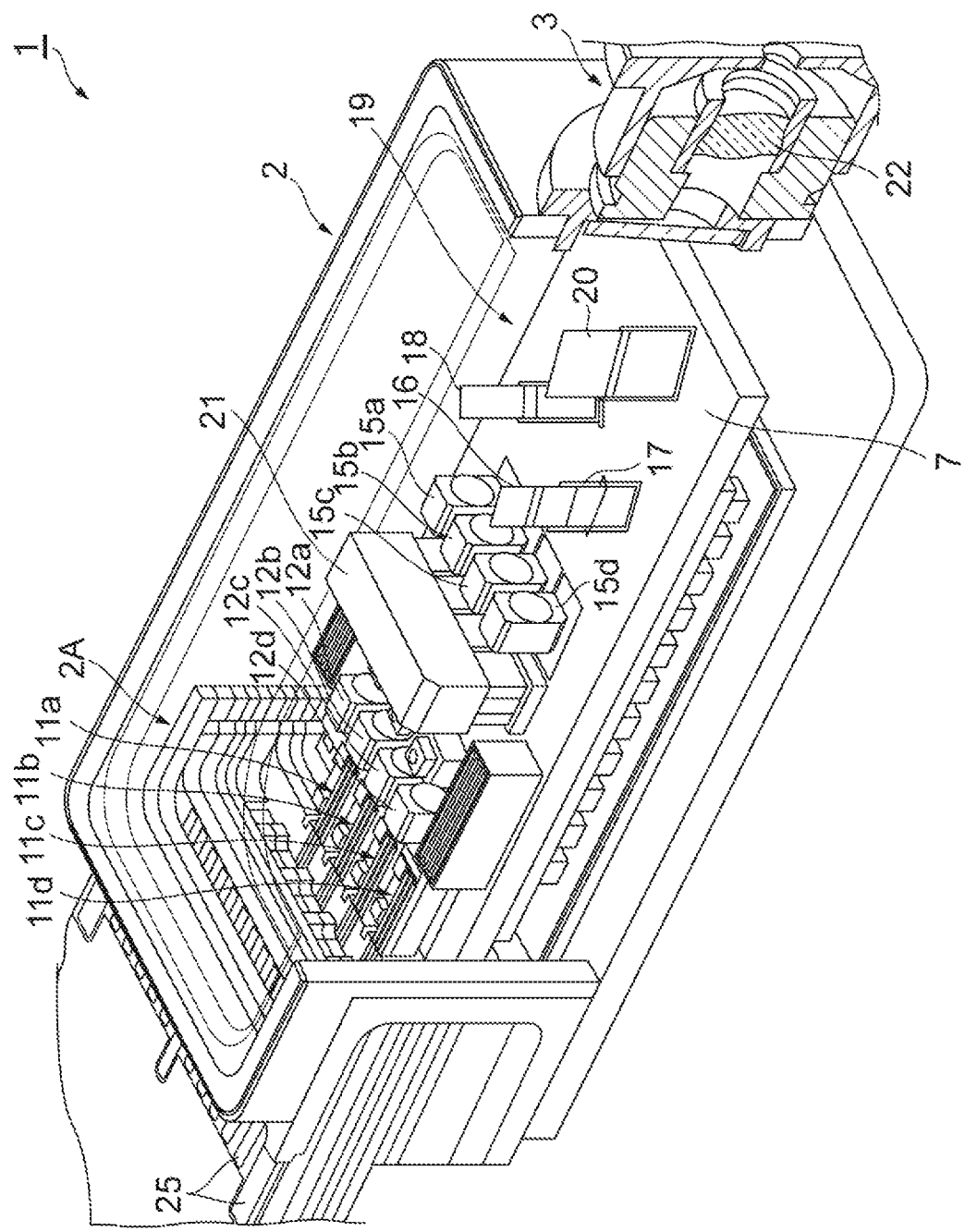
FIG. 1 is a perspective view of an internal structure of an optical module according to an embodiment.

First, descriptions will be given in series of the contents of an embodiment of the present disclosure. An optical modulator carrier assembly according to the embodiment includes a transmission member having a first surface and a second surface, the first surface having a signal wiring pattern and a ground pattern, the second surface being provided on an opposite side of the transmission member from the first surface, an optical modulator opposed to the first surface, the optical modulator having one electrode pad conductively bonded to the signal wiring pattern and having the other electrode pad conductively bonded to the ground pattern, a first via provided extending through from the first surface to the second surface, the first via having one end on the first surface electrically connected to the signal wiring pattern, a second via provided extending through from the first surface to the second surface, the second via having one end on the first surface electrically connected to the ground pattern via a terminating resistor, and a conductor having an inductor component and electrically connecting the other end of the first via on the second surface with the other end of the second via on the second surface.

In this optical modulator carrier assembly, a high-frequency signal propagated through the signal wiring pattern of the transmission member is supplied to one electrode pad of a semiconductor laser chip. This brings an optical modulator of the semiconductor laser chip into operation to modulate laser light output from a laser diode of the semiconductor laser chip. Then, the modulated optical signal is output from the semiconductor laser chip to the outside of the optical modulator carrier assembly.

In this optical modulator carrier assembly, since each electrode pad of the semiconductor laser chip is conductively bonded to the signal wiring pattern and the ground pattern of the transmission member, it is possible to reduce an inductance component and suppress an impedance mismatch as compared to a structure where such bonding is made via a wire. This in turn makes it possible to suppress an occurrence of reflection and/or transmission loss of the high-frequency signal and degradation in transmission characteristics.

In addition, the optical modulator carrier assembly includes the first via and the second via that extend through the transmission member from the first surface to the second surface. One end of the first via is electrically connected to the signal wiring pattern, one end of the second via is electrically connected to the ground pattern via the terminating resistor, and the other ends of the first via and the second via are electrically connected to each other via the conductor having an inductor component. That is, the conductor increases the inductance between the signal wiring pattern and the terminating resistor. This makes it possible to further improve the high-frequency characteristics (for example, S21 characteristics) of the optical modulator carrier assembly. Further, the conductor having an inductor component is disposed on the second surface remote from the semiconductor laser chip, so that the conductor can be disposed without obstructing the disposition of the semiconductor laser chip, and inductor components of the first via and the second via can also contribute to the improvement in high-frequency characteristics.

In the above optical modulator carrier assembly, the conductor may be a wire. As the conductor, a wiring pattern made of metal can be used other than a wire. This increases the inductance of the conductor, and accordingly, the high-frequency characteristics can be more effectively improved.

The above optical modulator carrier assembly may further include a first capacitor provided between the signal wiring pattern and the ground pattern. This makes it possible to further improve the high-frequency characteristics. In this structure, the first capacitor may include a wiring pattern protruding from one of the signal wiring pattern and the ground pattern and extending along an edge of the other of the signal wiring pattern and the ground pattern. This allows the first capacitor to be implemented with a simple structure.

The above optical modulator carrier assembly may further include a second capacitor provided on the second surface and connected in series between the other end of the first via on the second surface and the other end of the second via on the second surface. This makes it possible to suppress a current flowing through the ground pattern via the conductor and the terminating resistor, so that power consumption of the optical modulator carrier assembly can be reduced.

In the above optical modulator carrier assembly, the optical modulator may be integrated into the semiconductor laser chip.

An optical module according to an embodiment includes any one of the above optical modulator carrier assemblies and a housing to house an optical modulator carrier assembly. The optical module provided with any one of the above optical modulator carrier assemblies can improve high-frequency characteristics.

Details of Embodiment of Present Disclosure

A description will be given below of specific examples of the optical modulator carrier assembly and the optical module according to the embodiment of the present disclosure with reference to the drawings. It should be noted that the present disclosure is not limited to these examples and is intended to be defined by the claims and to include all modifications within the scope of the claims and their equivalents. In the following description, that is, in the description given with reference to the drawings, the same components are denoted by the same reference numerals, and any redundant description will be omitted.

Figure 2:
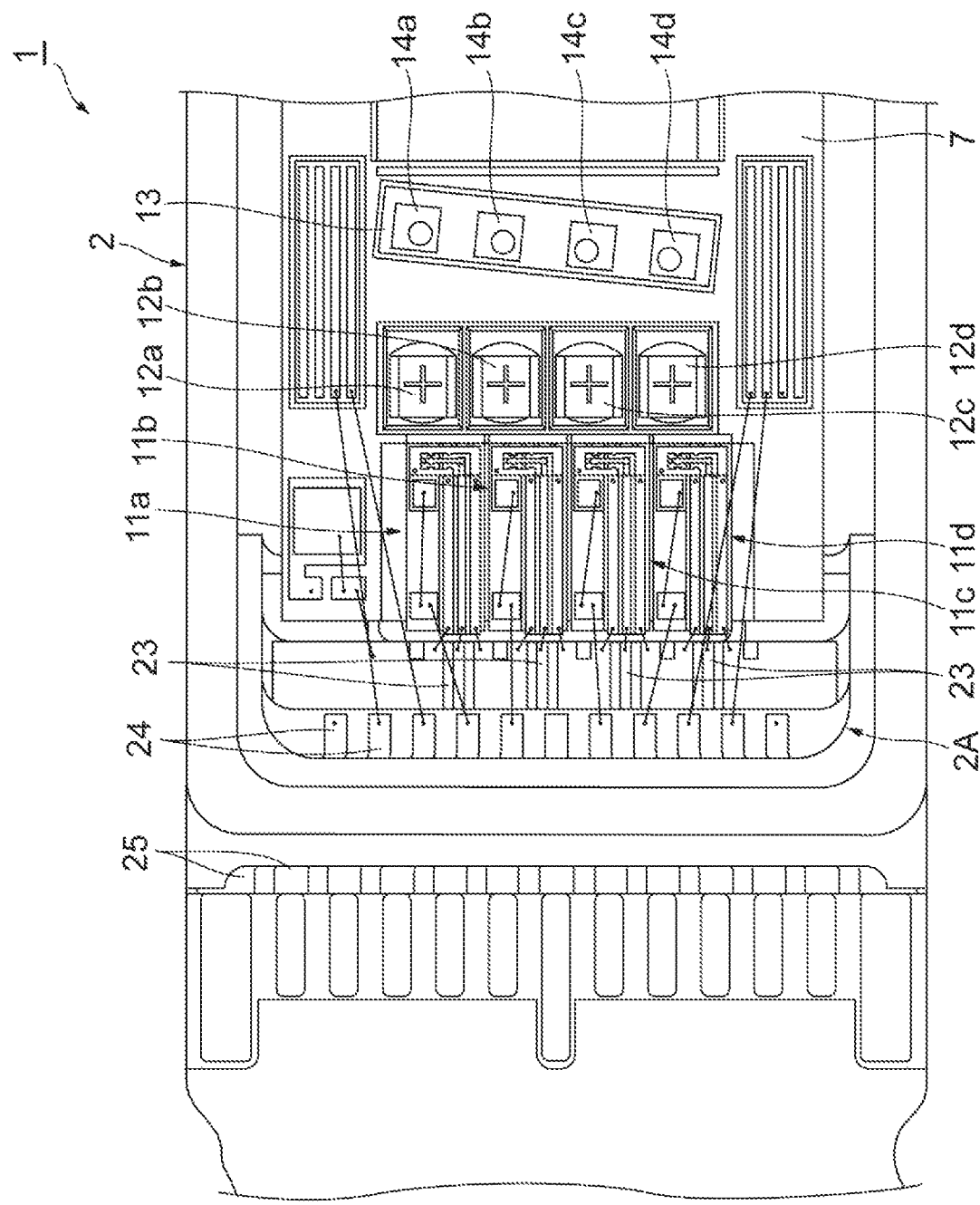
FIG. 2 is an enlarged plan view of part of FIG. 1.

FIG. 1 is a perspective view of an internal structure of an optical module 1 according to an embodiment. FIG. 2 is an enlarged plan view of part of FIG. 1. The optical module 1 is an optical module (Transmitter Optical SubAssembly; TOSA) including a housing 2 having a rectangular parallelepiped shape and an optical coupler 3 having a cylindrical shape with a flange. The optical module 1 includes N (N is an integer of at least 2) light emitters 11a to 11d, N first lenses 12a to 12d, a carrier 13, N light receiving elements (photodiodes, PD) 14a to 14d, N second lenses 15a to 15d, an optical component 21, and a multiplexing optical system 19 in the housing 2. In one example, the optical module 1 is a four-channel (N=4) optical module. The light emitters 11a to 11d, the first lenses 12a to 12d, the carrier 13, the second lenses 15a to 15d, the optical component 21, and the multiplexing optical system 19 are arranged on a flat main surface of a base member 7 provided inside the housing 2.

Further, the housing 2 has a feedthrough 2A. The feedthrough 2A passes through a rear wall of the housing 2. In a portion of the feedthrough 2A located outside the housing 2, a plurality of terminals 25 for electrical connection with an external device are provided side by side along the rear wall of the housing 2. In a portion of the feedthrough 2A located inside the housing 2, a plurality of terminals 24 and N signal lines 23 acting as a coplanar line are provided. The N signal lines 23 and the plurality of terminals 24 are each electrically connected to a corresponding one of the terminals 25.

In the optical module 1, the light emitters 11a to 11d acting as light sources are individually driven, and the light emitters 11a to 11d individually output a signal light beam. A drive signal applied to the light emitters 11a to 11d is supplied from outside the optical module 1. The signal light beam is a light beam modulated in accordance with the drive signal. A detailed structure of the light emitters 11a to 11d will be described later. The first lenses 12a to 12d are optically coupled to the light emitters 11a to 11d, respectively. The signal light beams output from the light emitters 11a to 11d impinge on the first lenses 12a to 12d, respectively.

The carrier 13 is a rectangular parallelepiped member whose longitudinal axis intersects each optical axis of the signal light beams and is disposed on an optical path between the first lenses 12a to 12d and the second lenses 15a to 15d. Note that the carrier 13 has a dielectric multilayer film (beam splitter) that is at an angle to each optical axis of the signal light beams, and splits, when the signal light beams pass through the dielectric multilayer film, part of each signal light beam.

The PDs 14a to 14d are mounted on the carrier 13 and each receive the part of each signal light beam thus split to detect light intensity of the signal light beam. The PDs 14a to 14d are mounted on the carrier 13 with back surfaces of the PDs 14a to 14d opposed to the carrier 13. The PDs 14a to 14d receive, using their back surfaces, part of each signal light beam split by the dielectric multilayer film. The second lenses 15a to 15d are optically coupled to the first lenses 12a to 12d with the carrier 13 interposed between the second lenses 15a to 15d and the first lenses 12a to 12d. The signal light beams output from the first lenses 12a to 12d each pass through the carrier 13 to form a beam waist and then impinge on the optical component 21 while expanding again. The optical component 21 transmits the signal light beams that have passed through the carrier 13 and intercept return light beams from reflection points after the second lenses 15a to 15d. Each of the signal light beams that have passed through the optical component 21 impinges on a corresponding one of the second lenses 15a to 15d.

The multiplexing optical system 19 is optically coupled to the second lenses 15a to 15d and multiplexes the signal light beams together. As shown in FIG. 1, the multiplexing optical system 19 includes a first WDM filter 16, a second WDM filter 17, a mirror 18, and a polarization beam multiplexer 20. The mirror 18 is optically coupled to second lenses 15a and 15b. A light reflecting surface of the mirror 18 is located on the optical axes of the second lenses 15a and 15b and is at an angle to the optical axes. The first WDM filter 16 is optically coupled to the second lens 15c. A wavelength selective surface of the first WDM filter 16 is located on the optical axis of the second lens 15c and is at an angle to the optical axis. The first WDM filter 16 transmits the signal light beam from the second lens 15c and reflects the signal light beam reflected off the mirror 18. As a result, the optical path of the signal light beam from the second lens 15a and the optical path of the signal light beam from the second lens 15c coincide with each other, and these signal light beams are multiplexed together.

The second WDM filter 17 is optically coupled to the second lens 15d. A wavelength selective surface of the second WDM filter 17 is located on the optical axis of the second lens 15d and is at an angle to the optical axis. The second WDM filter 17 transmits the signal light beam from the second lens 15d and reflects the signal light beam from the second lens 15b reflected off the mirror 18. As a result, the optical path of the signal light beam from the second lens 15b and the optical path of the signal light beam from the second lens 15d coincide with each other, and these signal light beams are multiplexed together. The polarization beam multiplexer 20 is a plate-shaped member that transmits light. The polarization beam multiplexer 20 multiplexes the signal light beam multiplexed by passing through the first WDM filter 16 and the signal light beam multiplexed by passing through the second WDM filter 17. The multiplexed signal light beam is output to the outside of the housing 2 through a window provided on a front wall of the housing 2.

The optical coupler 3 is a coaxial module having a lens 22 and a fiber stub. Note that FIG. 1 shows a cross section of the optical coupler 3 along the optical axis. The lens 22 is optically coupled to the multiplexing optical system 19. The fiber stub holds an optical fiber. The lens 22 condenses the signal light beam output from the polarization beam multiplexer 20 and guides the signal light beam to an end face of the optical fiber. After being aligned with the optical axis of the signal light beam, the optical coupler 3 is welded to the front wall of the housing 2. Note that the optical coupler 3 may further include an optical isolator that intercepts external light.

Figure 3:
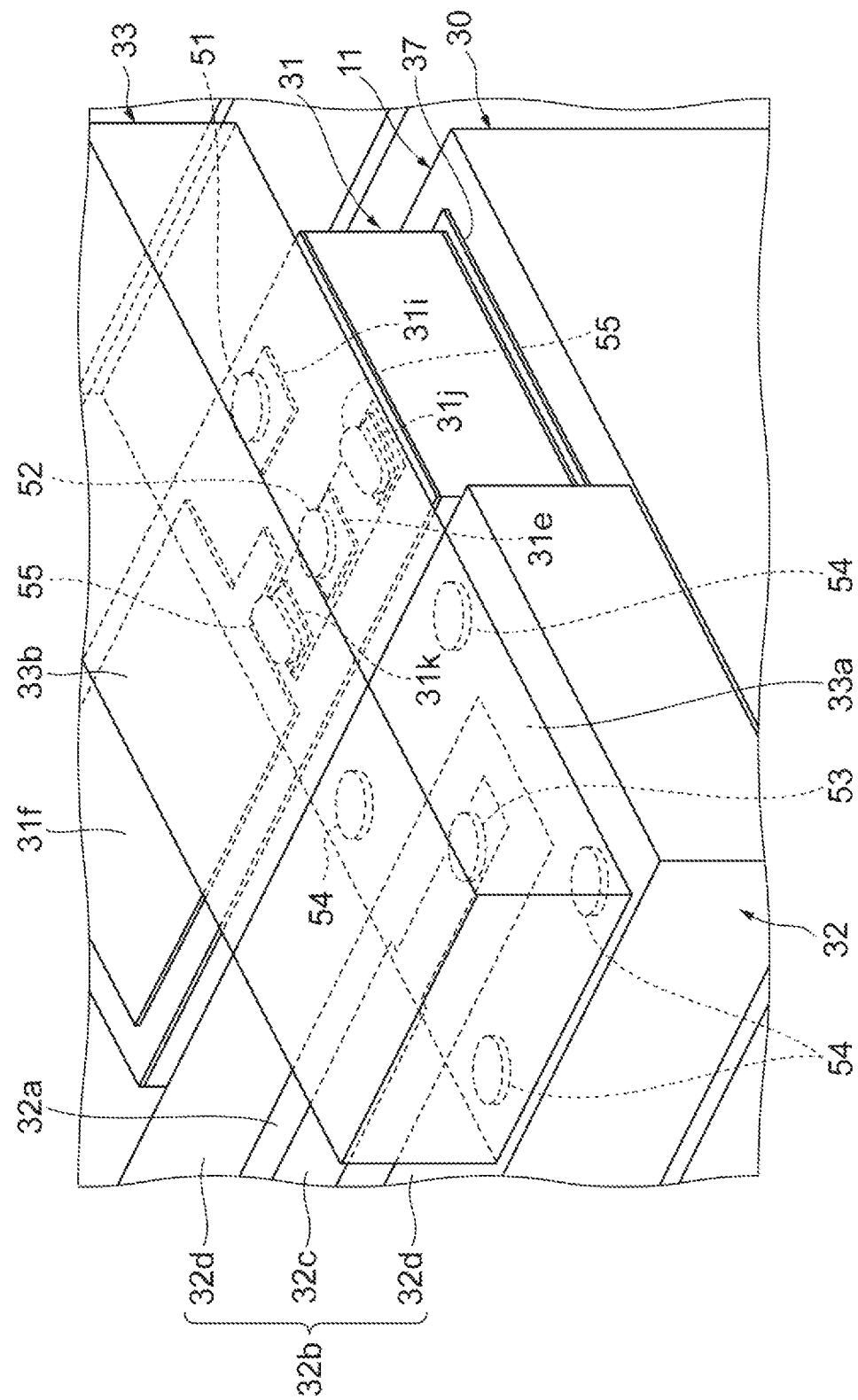
FIG. 3 is an enlarged perspective view of light emitters.
Figure 4:
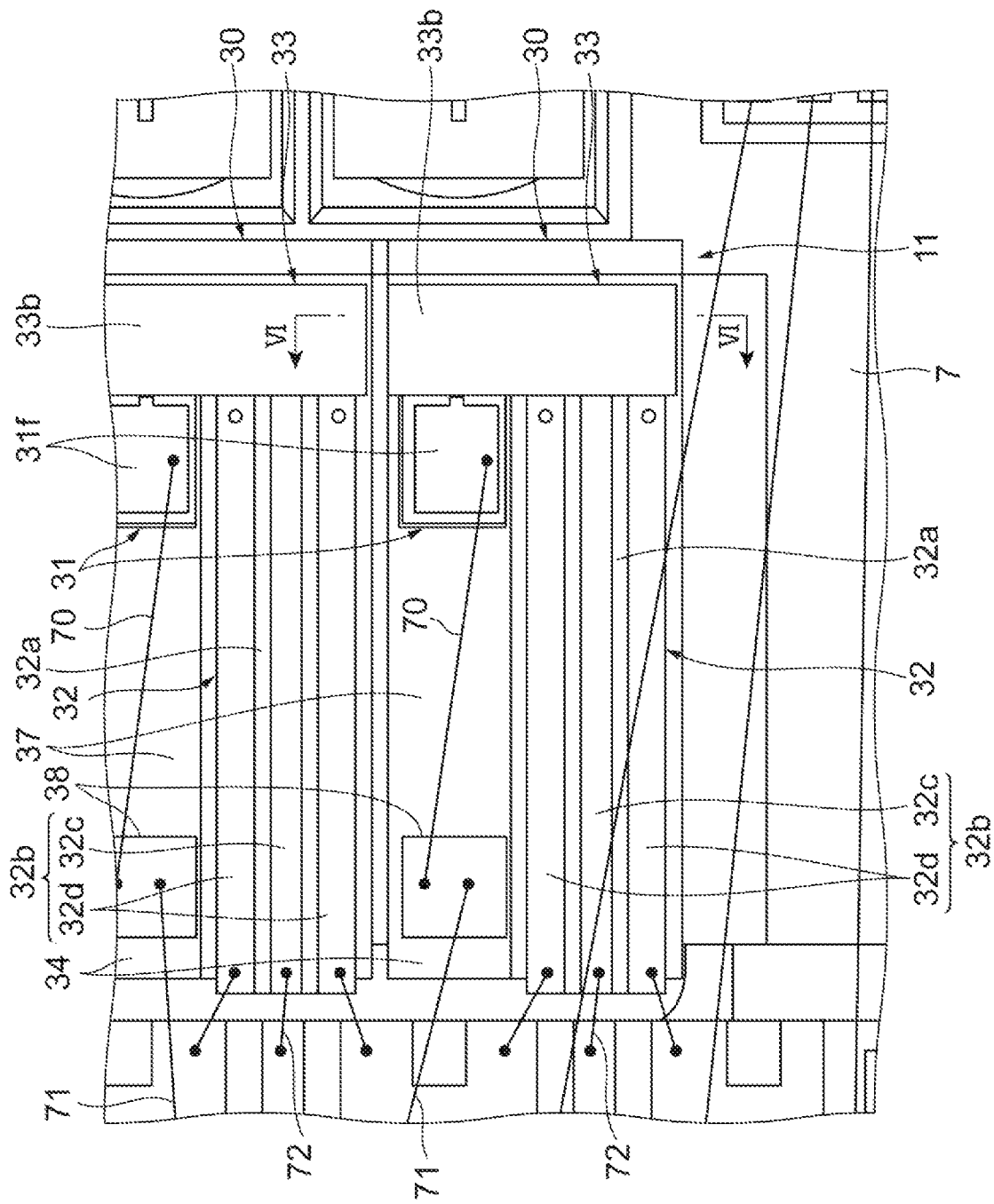
FIG. 4 is an enlarged plan view of a light emitter.

FIG. 3 is an enlarged perspective view of the light emitters 11a to 11d shown in FIG. 1 (hereinafter, the light emitters 11a to 11d are collectively referred to as "light emitter 11"). FIG. 4 is an enlarged plan view of the light emitter 11 shown in FIG. 2. The light emitter 11 is an example of the optical modulator carrier assembly according to the present embodiment. As shown in these figures, the light emitter 11 includes a subcarrier 30, an electroabsorption modulator integrated laser diode (EML) chip 31 and a transmission member 32 mounted side by side on the subcarrier 30, and a transmission member 33 in the form of a substrate disposed on both the EML chip 31 and the transmission member 32. The EML chip 31 is an example of the semiconductor laser chip according to the present embodiment. The subcarrier 30 is made of an insulator and is mounted on the base member 7. The EML, chip 31 is mounted on a ground pattern 37 provided on the subcarrier 30, and a back electrode (cathode) of the EML chip 31 is conductively bonded to the ground pattern 37.

A decoupling capacitor 38 is mounted on the ground pattern 37 provided on the subcarrier 30. A lower-surface electrode of the decoupling capacitor 38 is electrically connected to the ground pattern 37 via a conductive adhesive such as solder. An upper-surface electrode of the decoupling capacitor 38 is electrically connected, via a wire 70, to an electrode pad 31f of the EML chip 31. Further, the upper-surface electrode of the decoupling capacitor 38 is electrically connected, with a wire 71, to any one of the plurality of terminals 24 (see FIG. 2) provided in the feedthrough 2A of the housing 2.

Figure 5:
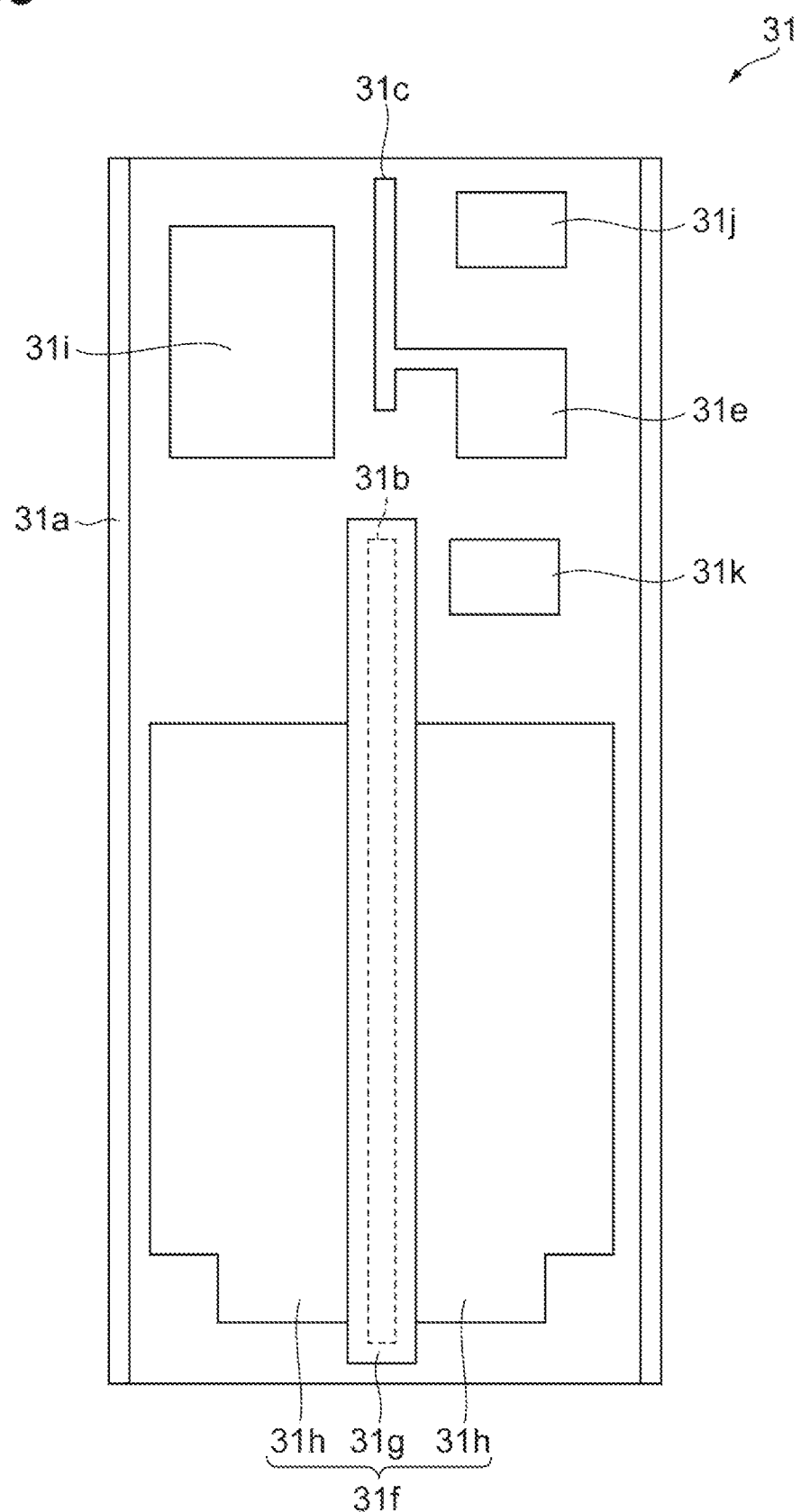
FIG. 5 is a plan view of an EML chip.

FIG. 5 is a plan view of the EML chip 31. The EML chip 31 has a rectangular parallelepiped shape whose longitudinal axis coincides with a front-back axis of the optical module 1. According to one example, the EML chip 31 has a thickness of 100 µm, a longitudinal length of 550 µm, and a lateral width of 250 µm. The EML chip 31 has a monolithic structure where a laser diode and an optical modulator are integrated on a common substrate. The EML chip 31 has an anode electrode 31b of the laser diode and an anode electrode 31c of the optical modulator on a main surface 31a. The main surface 31a is partially covered by an insulating film (for example, silicon nitride). The anode electrode 31b of the laser diode is provided on a laser resonator of the laser diode, the anode electrode 31b extending along the longitudinal axis of the EML chip 31 and being located near a center of the main surface 31a along the lateral axis of the EML chip 31. The anode electrode 31c of the optical modulator extends along the longitudinal axis of the EML chip 31 to be aligned with the anode electrode 31b of the laser diode along the longitudinal axis.

The EML chip 31 further has electrode pads 31e, 31f that are metal films provided on the main surface 31a. The electrode pad 31e and the anode electrode 31c are arranged side by side along the lateral axis of the EML chip 31 and the electrode pad 31e is electrically connected to the anode electrode 31c. The electrode pad 31e has, for example, a rectangular shape in plan view. The electrode pad 31e receives a high-frequency modulated signal and inputs the modulated signal to the anode electrode 31c of the optical modulator. The electrode pad 31f is electrically connected to the anode electrode 31b. The electrode pad 31f receives a DC bias current for laser driving via the wires 71, 70 and inputs the DC bias current to the anode electrode 31b of the laser diode. The electrode pad 31f includes a portion 31g extending along the longitudinal axis of the EML chip 31, and a pair of portions 31h provided on both sides of the portion 31g along the lateral axis of the EML chip 31. The portion 31g covers the anode electrode 31b. That is, the portion 31g is located near the center of the main surface 31a along the lateral axis of the EML chip 31 and is provided on the laser resonator of the laser diode.

The EML chip 31 further has an electrode pad 31i that is a metal film provided on the main surface 31a. The electrode pad 31i is electrically connected to a cathode electrode of the optical modulator. The electrode pad 31i is provided on the main surface 31a such that the anode electrode 31c is interposed between the electrode pads 31e, 31i. In other words, the electrode pads 31e, 31i are arranged side by side along the lateral axis of the EML chip 31, and the anode electrode 31c is disposed between the electrode pads 31e, 31i. The electrode pad 31i has, for example, a rectangular shape in plan view.

The EML chip 31 further has metal pads 31j, 31k provided on the main surface 31a. The metal pads 31j, 31k may or need not be electrically connected to the cathode electrode of the optical modulator. The metal pads 31j, 31k are arranged side by side along the longitudinal axis of the EML chip 31, and the electrode pad 31e is located between the metal pads 31j, 31k. In other words, along the longitudinal axis of the EML chip 31, the metal pad 31j is disposed between the electrode pad 31e and a front end of the EML chip 31, and the metal pad 31k is disposed between the electrode pad 31e and the portions 31h of the electrode pad 31f. The metal pads 31j, 31k have, for example, a rectangular shape in plan view.

Referring again to FIG. 3 and FIG. 4. The transmission member 32 is a wiring substrate extending along the longitudinal axis of the EML chip 31 (that is, the front-back axis of the optical module 1), the transmission member 32 corresponding to a wiring pattern formed on a dielectric substrate (for example, a ceramic substrate). The transmission member 32 and the EML chip 31 are arranged side by side along the lateral axis of the EML chip 31 (that is, a left-right axis of the optical module 1). The transmission member 32 has a main surface 32a. The main surface 32a and the main surface 31a are arranged side by side along the lateral axis of the EML chip 31. The main surface 32a includes a coplanar line 32b. The coplanar line 32b is a transmission line and transmits the modulated signal toward the anode electrode 31c of the EML chip 31. Specifically, the coplanar line 32b includes a signal wiring pattern 32c and a ground pattern 32d.

The signal wiring pattern 32c is a conductive metal film that guides the modulated signal and extends along the EML chip 31. One end of the signal wiring pattern 32c is located at the same position as the electrode pad 31e when viewed along the lateral axis of the EML chip 31. The other end of the signal wiring pattern 32c is electrically connected to a corresponding one of the signal lines 23 shown in FIG. 2 via a wire 72 shown in FIG. 4. As shown in FIG. 3, the signal wiring pattern 32c has a portion overlapping the transmission member 33 and a portion not overlapping the transmission member 33 when viewed along a normal line of the main surface 32a. The portion overlapping the transmission member 33 is a portion including the one end of the signal wiring pattern 32c. The ground pattern 32d is a conductive metal film that is provided to surround the signal wiring pattern 32c, and a certain gap is provided between the ground pattern 32d and the signal wiring pattern 32c. A reference potential is applied to the ground pattern 32d.

The transmission member 33 extends over both the main surface 32a of the transmission member 32 and the main surface 31a of the EML chip 31 along the lateral axis of the EML chip 31. The transmission member 33 is a wiring substrate corresponding to a wiring pattern formed on a substrate made of a dielectric and has a flat main surface (first surface) 33a opposed to the main surfaces 31a, 32a and a flat back surface (second surface) 33b on the opposite side of the transmission member 33 from the main surface 33a. The transmission member 33 electrically connects the signal wiring pattern 32c and the electrode pad 31e via a transmission line (described later) provided on the main surface 33a. Therefore, the signal wiring pattern 32c is electrically connected to the anode electrode 31c of the optical modulator via the transmission member 33 and the electrode pad 31e.

Figure 6:
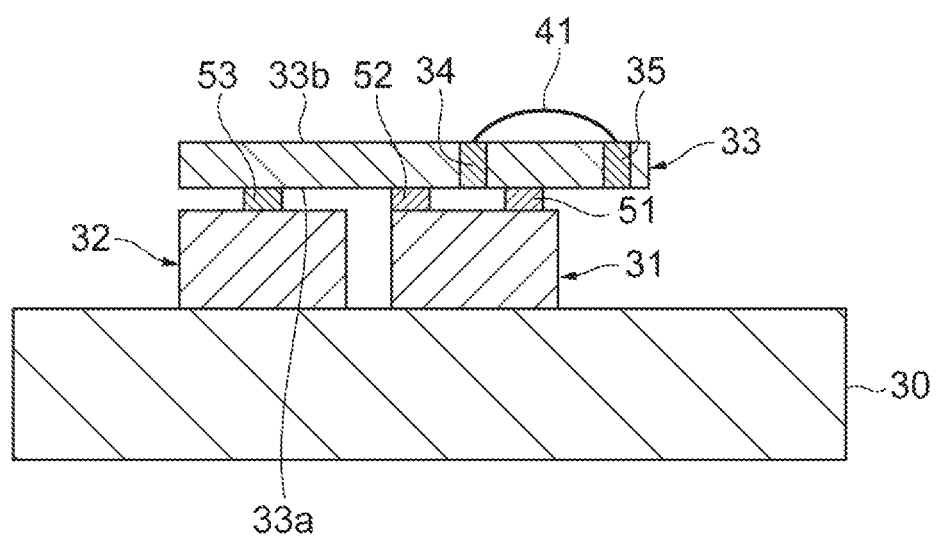
FIG. 6 is a cross-sectional view taken along line VI-VI of FIG. 4.
Figure 7:
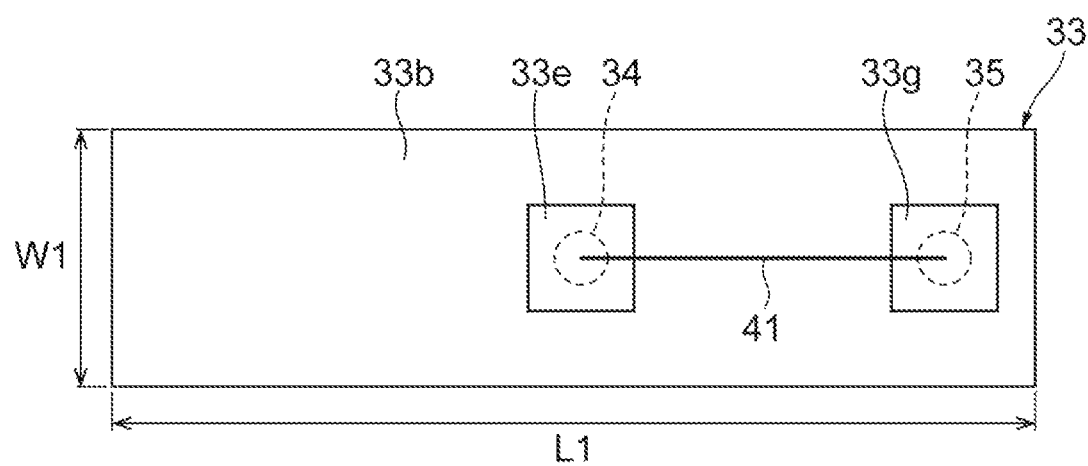
FIG. 7 shows a back surface of a transmission member.
Figure 8:
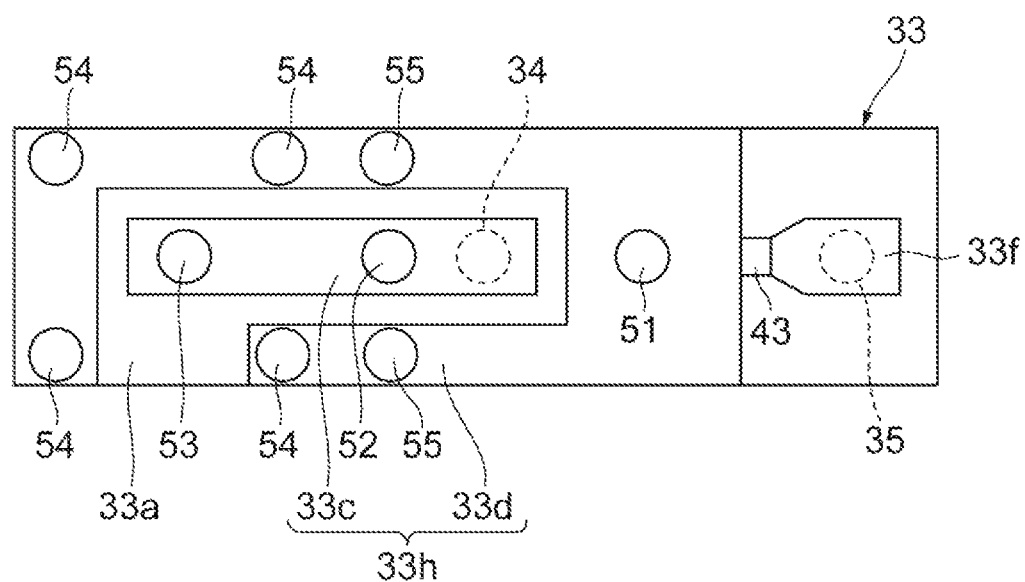
FIG. 8 shows a main surface of the transmission member.
Figure 9:
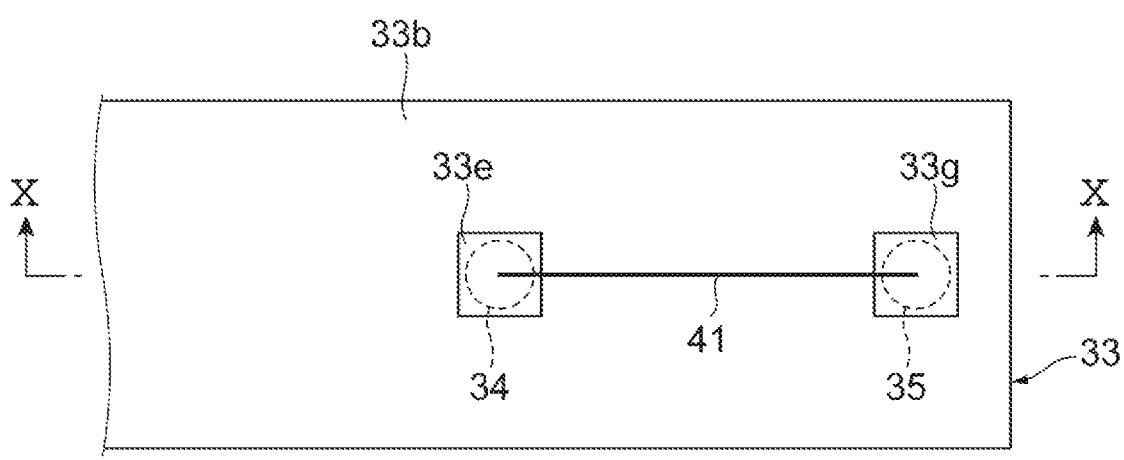
FIG. 9 is an enlarged view of a portion of the transmission member adjacent to the EML chip, showing the back surface of the transmission member.
Figure 10:
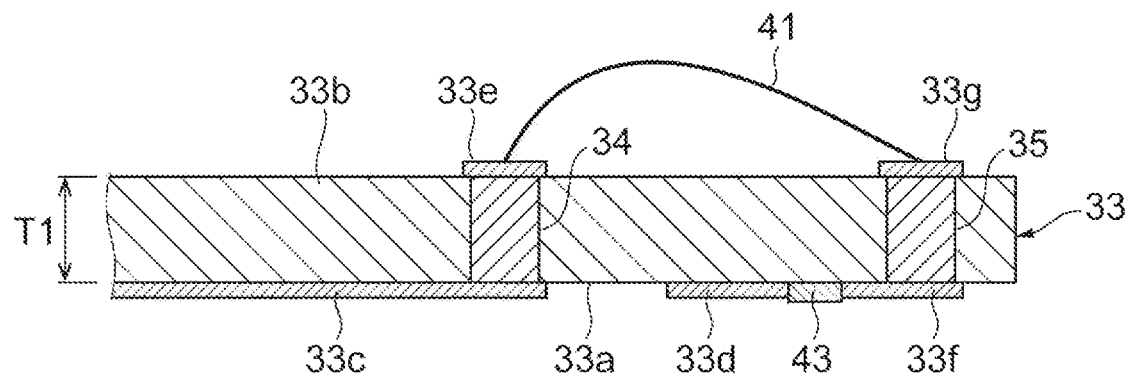
FIG. 10 is an enlarged view of the portion of the transmission member adjacent to the EML chip, showing an X-X cross section shown in FIG. 9.
Figure 11:
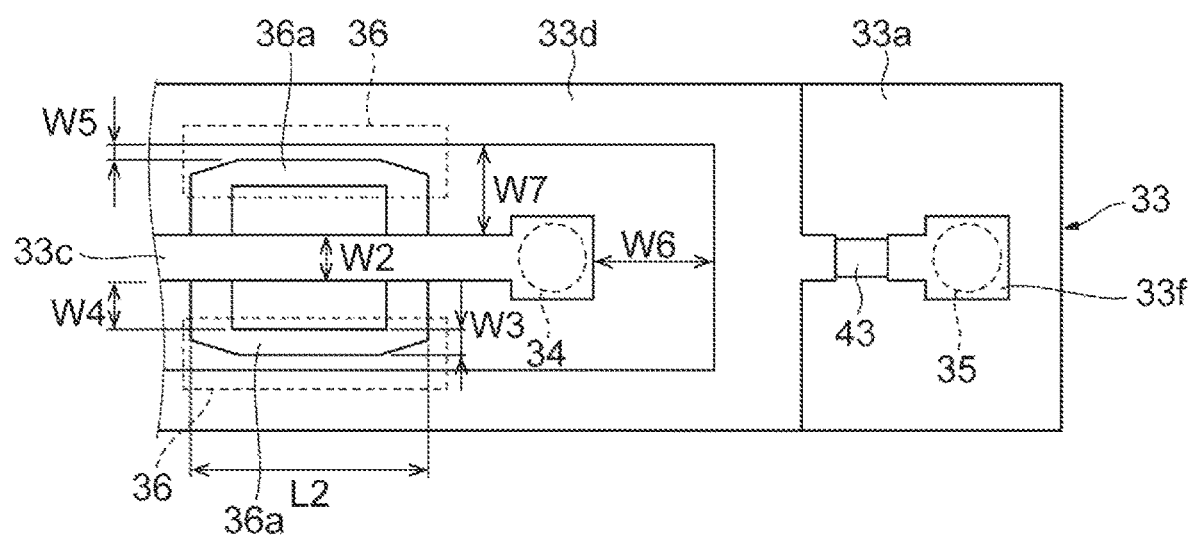
FIG. 11 is an enlarged view of the portion of the transmission member adjacent to the EML chip, showing the main surface of the transmission member.

FIG. 6 is a cross-sectional view taken along line VI-VI of FIG. 4, showing cross sections of the EML chip 31, the transmission members 32, 33, and the subcarrier 30 along the lateral axis of the EML chip 31. FIG. 7 shows the back surface 33b of the transmission member 33, and FIG. 8 shows the main surface 33a of the transmission member 33. Further, FIG. 9, FIG. 10, and FIG. 11 are enlarged views of a portion of the transmission member 33 adjacent to the EML chip 31. FIG. 9 shows the back surface 33b of the transmission member 33, FIG. 10 shows a cross section taken along line X-X shown in FIG. 9, and FIG. 11 shows the main surface 33a of the transmission member 33.

As shown in FIG. 8 and FIG. 11, the transmission member 33 has a signal wiring pattern 33c and a ground pattern 33d that are conductive metal films formed on the main surface 33a. The signal wiring pattern 33c extends along the lateral axis of the EML chip 31. The ground pattern 33d is provided to surround the signal wiring pattern 33c, and a certain gap is provided between the ground pattern 33d and the signal wiring pattern 33c. However, the ground pattern 33d is not provided in a region of the main surface 33a that is opposed to the signal wiring pattern 32c; therefore, the ground pattern 33d has a shape as if the ground pattern 33d is partially cut out. The signal wiring pattern 33c and the ground pattern 33d form a coplanar line 33h that is a transmission line.

As shown in FIG. 3 and FIG. 8, metal bumps 52, 53 are provided on the signal wiring pattern 33c. The metal bump 52 is disposed, on one side of the signal wiring pattern 33c, adjacent to the EML chip 31, and the metal bumps 53 is disposed, on the other side of the signal wiring pattern 33c, adjacent to the transmission member 32. The metal bump 52 is sandwiched between the signal wiring pattern 33c of the transmission member 33 and the electrode pad 31e of the EML chip 31, and the signal wiring pattern 33c and the electrode pad 31e are conductively bonded to each other via the metal bump 52. The metal bump 53 is sandwiched between the signal wiring pattern 33c of the transmission member 33 and the signal wiring pattern 32c of the transmission member 32, and these signal wiring patterns 32c, 33c are conductively bonded to each other via the metal bump 53. The metal bumps 52, 53 are, for example, Au bumps. Note that the conductive bonding is achieved by not only such a metal bump, but also solder, for example.

As shown in FIG. 3 and FIG. 8, a metal bump 51, a plurality of metal bumps 54, and a pair of metal bumps 55 are provided on the ground pattern 33d. The metal bump 51 is disposed, on one side of the ground pattern 33d, adjacent to the EML chip 31, and the plurality of metal bumps 54 are dispersedly arranged, on the other side of the ground pattern 33d, adjacent to the transmission member 32. The pair of metal bumps 55 are arranged at positions between which the metal bump 52 is located. The metal bump 51 is sandwiched between the ground pattern 33d of the transmission member 33 and the electrode pad 31i of the EML chip 31, and the ground pattern 33d and the electrode pad 31i are conductively bonded to each other via the metal bump 51. Further, the plurality of metal bumps 54 are sandwiched between the ground pattern 33d of the transmission member 33 and the ground pattern 32d of the transmission member 32, and these ground patterns 32d, 33d are conductively bonded to each other via the plurality of metal bumps 54. Further, the pair of metal bumps 55 are sandwiched between the ground pattern 33d of the transmission member 33 and the metal pads 31j, 31k of the EML chip 31, and the ground pattern 33d and the metal pads 31j, 31k are conductively bonded to each other via the pair of metal bumps 55. The metal bumps 51, 54, 55 are, for example, Au bumps. Note that the conductive bonding is achieved by not only such a metal bump, but also solder, for example.

The signal wiring pattern 33c transmits the high-frequency modulated signal received from the signal wiring pattern 32c to the electrode pad 31e of the optical modulator. This brings the optical modulator of the EML chip 31 into operation to modulate the laser light output from the laser diode of the EMI chip 31. Then, the modulated optical signal is output from the EML chip 31.

The transmission member 33 further has a conductive first via 34 and second via 35 provided extending through from the main surface 33a and the back surface 33b. The first via 34 is provided, on one side of the signal wiring pattern 33c, at a position overlapping the signal wiring pattern 33c when viewed along a thickness of the transmission member 33. According to the present embodiment, the first via 34 is located adjacent to the opposite side of the metal bump 52 from the metal bump 53 along a direction of extension of the signal wiring pattern 33c. In other words, the metal bump 52 is located between the first via 34 and the metal bump 53 along the direction of extension of the signal wiring pattern 33c. Therefore, a conduction distance from the metal bump 53 to the first via 34 is longer than a conduction distance from the metal bump 53 to the metal bump 52. One end of the first via 34 on the main surface 33a is electrically connected (for example, in contact) with the signal wiring pattern 33c. The other end of the first via 34 on the back surface 33b is electrically connected (for example, in contact) with a metal pad 33e that is a conductive metal film provided on the back surface 33b.

The second via 35 is provided outside the ground pattern 33d when viewed along the thickness of the transmission member 33. One end of the second via 35 on the main surface 33a is electrically connected (for example, in contact) with a metal pad 33f that is a conductive metal film provided on the main surface 33a. The other end of the second via 35 on the back surface 33b is electrically connected (for example, in contact) with a metal pad 33g that is a conductive metal film provided on the back surface 33b. According to the present embodiment, the second via 35 and the first via 34 are arranged side by side along the direction of extension of the signal wiring pattern 33c. The transmission member 33 has a terminating resistor 43 for impedance matching on the back surface 33b. The terminating resistor 43 is located between the metal pad 33f and the ground pattern 33d, and the metal pad 33f and the ground pattern 33d are electrically connected to each other via the terminating resistor 43. That is, one end of the second via 35 on the main surface 33a is electrically connected to the ground pattern 33d via the terminating resistor 43.

The transmission member 33 further has an elongated conductor 41 provided on the back surface 33b. The conductor 41 has an inductor component and electrically connects the other end of the first via 34 on the back surface 33b with the other end of the second via 35 on the back surface 33b. In one example, the conductor 41 is a wire. Alternatively, the conductor 41 may be a wiring pattern such as a distributed constant line or a combination of a wire and a distributed constant line. Specifically, one end of the conductor 41 is connected to the metal pad 33e, and the other end of the conductor 41 is connected to the metal pad 33g. When the conductor 41 is a wire, the conductor 41 may have a diameter of, for example, 18 μm to 38 μm, or the conductor 41 may have a diameter of 20 μm to 25 μm. The conductor 41 may have a length of, for example, 0.4 mm to 1.0 mm, or the conductor 41 may have a length of 0.4 mm to 0.8 mm.

As shown in FIG. 11, the transmission member 33 further has a pair of capacitive distributed constant circuits 36 (first capacitor). These capacitive distributed constant circuits 36 are provided between the signal wiring pattern 33c and the ground pattern 33d on the main surface 33a. According to the present embodiment, the capacitive distributed constant circuits 36 each include a stub 36a that is a wiring pattern. The stub 36a forms a capacitive distributed constant matching circuit. Specifically, the stub 36a protrudes from one of the signal wiring pattern 33c and the ground pattern 33d (the signal wiring pattern 33c in FIG. 11) and extends along an edge of the other of the signal wiring pattern 33c and the ground pattern 33d (the ground pattern 33d in FIG. 11). A certain gap is provided between the stub 36a and the ground pattern 33d (or the signal wiring pattern 33c), and parasitic capacitance creates the capacitive distributed constant circuits 36.

Note that, as a dimension example, a thickness T1 of the transmission member 33 is, for example, 0.1 mm, a length L1 of the transmission member 33 is, for example, 0.6 mm, and a width W1 of the transmission member 33 is, for example, 0.25 mm. Further, a width W2 of the signal wiring pattern 33c is, for example, 40 μm, a width W3 of the stub 36a is, for example, 20 μm, and a width W4 of the gap between the stub 36a and the signal wiring pattern 33c and a width W5 of the gap between the stub 36a and the ground pattern 33d are, for example, 15 μm. A length L2 of the capacitive distributed constant circuits 36 along the signal wiring pattern 33c and the ground pattern 33d is, for example, 300 μm. A width W6 of the gap between the signal wiring pattern 33c and the ground pattern 33d along the direction of extension of the signal wiring pattern 33c is, for example, 70 μm, and a width W7 of the gap between the signal wiring pattern 33c and the ground pattern 33d along a direction orthogonal to the direction of extension is, for example, 50 μm.

A description will be given of actions and effects obtained from the light emitter 11 (optical modulator carrier assembly) included in the optical module 1 according to the present embodiment. In the light emitter 11, the electrode pad 31e of the EML chip 31 is conductively bonded to the signal wiring pattern 33c of the transmission member 33, and the electrode pad 31i is conductively bonded to the ground pattern 33d of the transmission member 33, which makes it possible to reduce the inductance component and suppress an impedance mismatch as compared to a structure where such bonding is made via a wire. This in turn makes it possible to suppress an occurrence of reflection and/or transmission loss of the high-frequency signal and degradation in transmission characteristics.

Further, according to the present embodiment, the first via 34 and the second via 35 are provided through the transmission member 33. One end of the first via 34 is electrically connected to the signal wiring pattern 33c, one end of the second via 35 is electrically connected to the ground pattern 33d via the terminating resistor 43, and the other ends of the first via 34 and the second via 35 are electrically connected to each other via the conductor 41 having an inductor component. That is, the conductor 41 increases the inductance between the signal wiring pattern 33c and the terminating resistor 43.

Figure 12:
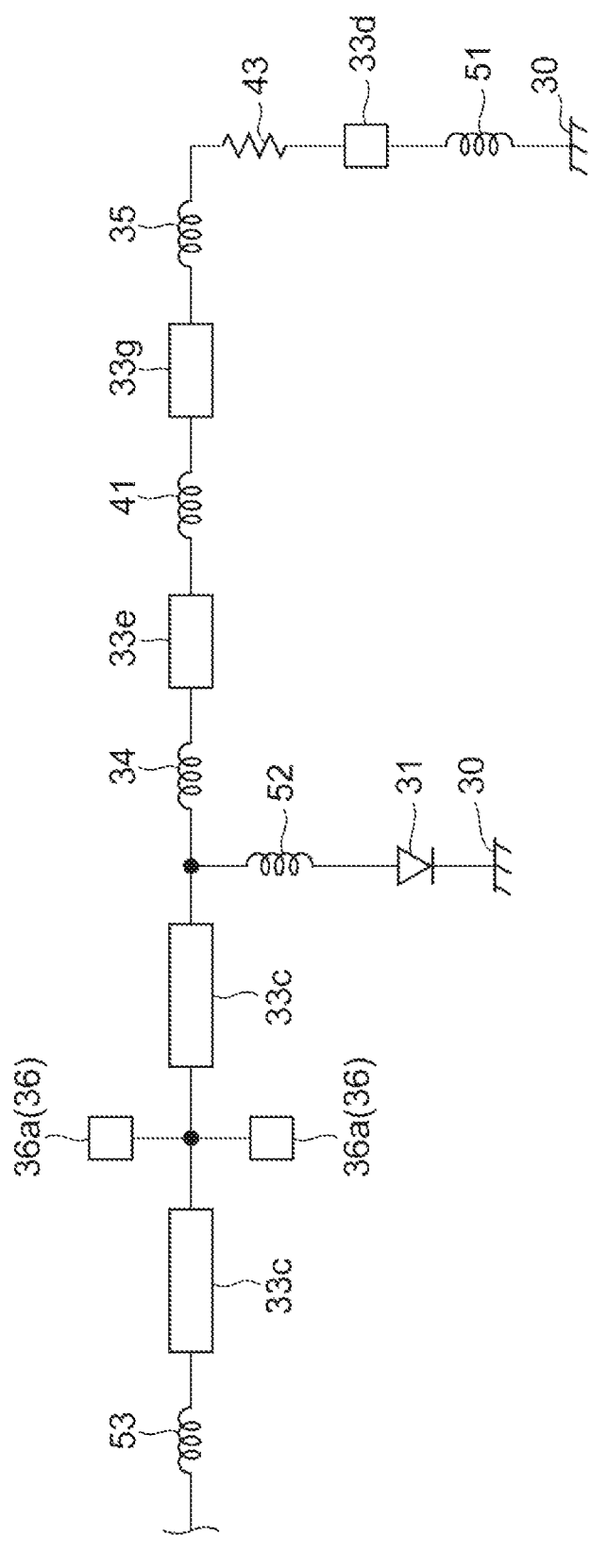
FIG. 12 is a diagram showing an equivalent circuit of the light emitter.

FIG. 12 is a diagram showing an equivalent circuit of the light emitter 11 according to the present embodiment. To the optical modulator of the EML chip 31, two stubs 36a of the input-side capacitive distributed constant circuits 36 are added, and the signal wiring pattern 33c is connected via an inductance of the metal bump 52. An inductance of the conductor 41 is connected between the terminating resistor 43 and the optical modulator of the EML chip 31 via inductances of the vias 34, 35. The terminating resistor 43 is connected to the cathode electrode of the optical modulator of the EML chip 31 via an inductance of the metal bump 51. This cathode electrode is connected to the back electrode of the EML chip 31. The cathode electrode is electrically isolated from the subcarrier 30 when it is not connected to the back electrode of the EML chip 31. FIG. 12 also shows the ground pattern 33d and the metal pads 33e, 33g. The inductance of the metal bumps 51, 52 is, for example, 0.15 nH.

Figure 13:
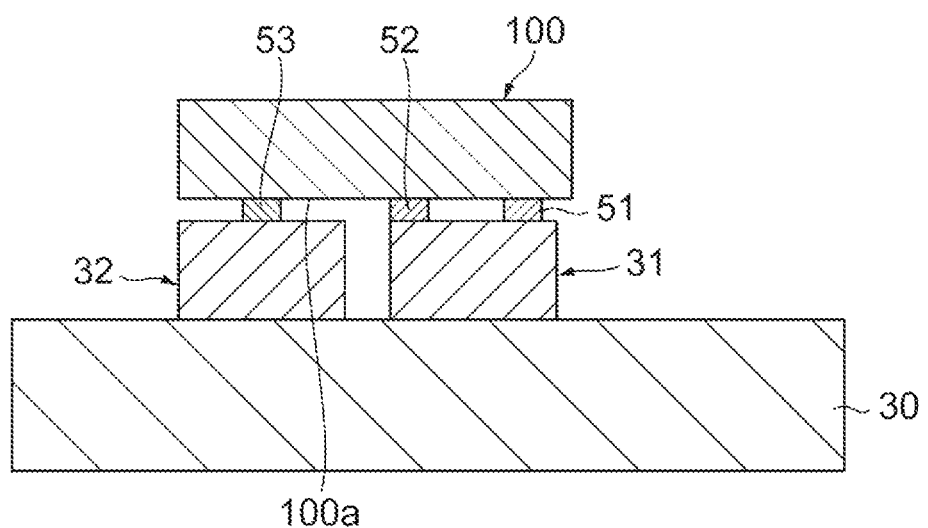
FIG. 13 is a diagram showing a structure of a transmission member serving as a comparative example, the diagram being a cross-sectional view corresponding to FIG. 6.
Figure 14:
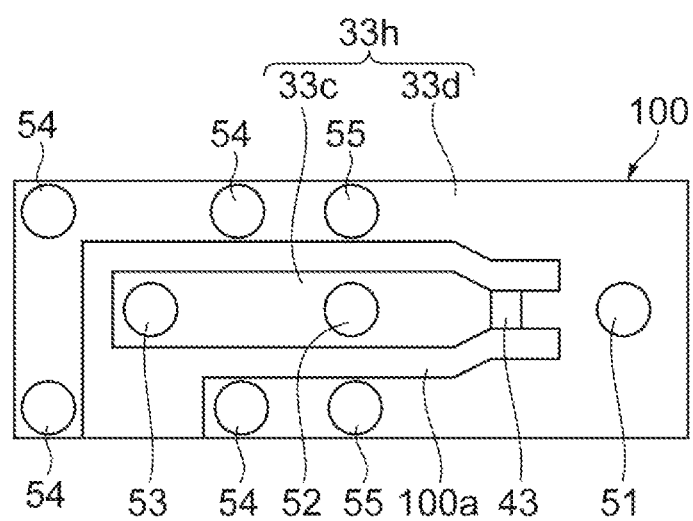
FIG. 14 is a diagram showing the structure of the transmission member serving as a comparative example, the diagram being a plan view of the main surface of the transmission member.
Figure 15:
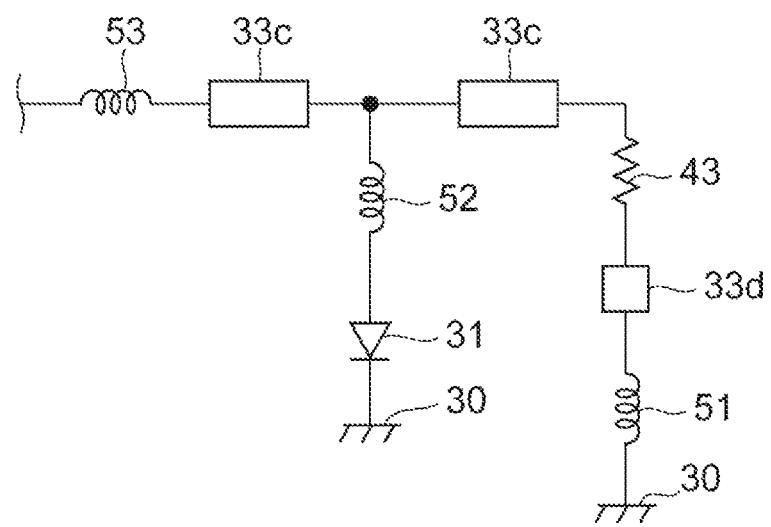
FIG. 15 is a diagram showing an equivalent circuit of a light emitter in a structure where the transmission member is provided.

FIG. 13 and FIG. 14 are diagrams showing a structure of a transmission member 100 serving as a comparative example. FIG. 13 is a cross-sectional view corresponding to FIG. 6, and FIG. 14 is a plan view of a main surface 100a of the transmission member 100. The transmission member 100 has the coplanar line 33h (the signal wiring pattern 33c and the ground pattern 33d) on the main surface 100a, as in the transmission member 33 according to the present embodiment. However, the terminating resistor 43 is disposed between the signal wiring pattern 33c and the ground pattern 33d, and one end of the signal wiring pattern 33c is connected to the ground pattern 33d via the terminating resistor 43. Further, the transmission member 100 includes none of the first via 34, the second via 35, the capacitive distributed constant circuit 36, and the conductor 41. FIG. 15 is a diagram showing an equivalent circuit of the light emitter in a structure where the transmission member 100 is provided. As shown in FIG. 15, the signal wiring pattern 33c is connected to the optical modulator of the EML chip 31 via the inductance of the metal bump 52. The signal wiring pattern 33c is connected to the terminating resistor 43, and the terminating resistor 43 is connected to the cathode electrode of the optical modulator of the EML chip 31 via the inductance of the metal bump 51.

Figure 16:
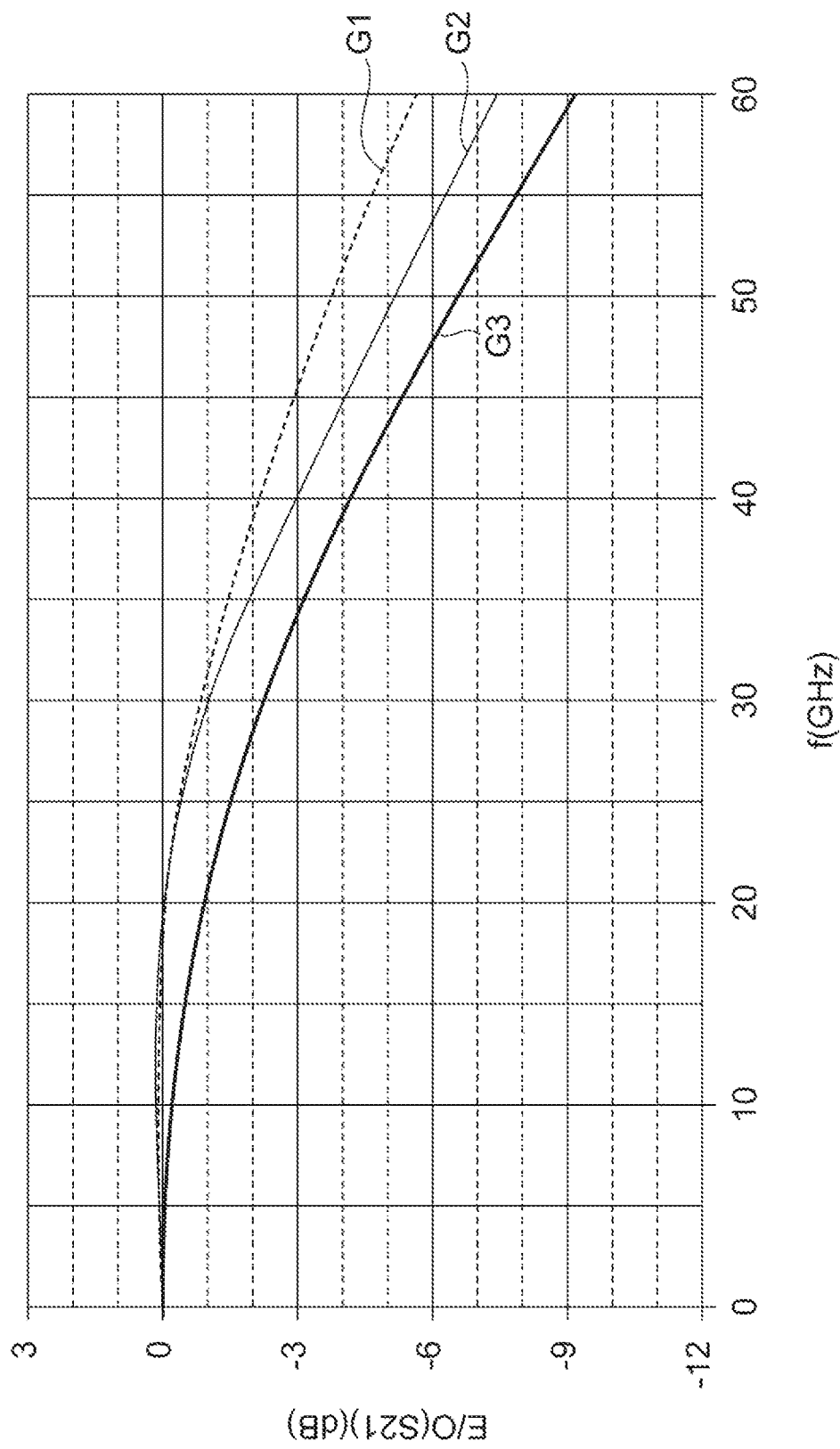
FIG. 16 is a graph showing a simulation result of input and output characteristics (S21 characteristics) of the light emitter.

FIG. 16 is a graph showing a simulation result of input and output characteristics (S21 characteristics) of the light emitter. In FIG. 16, the horizontal axis represents a signal frequency (unit: GHz), and the vertical axis represents an input/output ratio (unit: dB). Note that, in this simulation, the terminating resistor 43 is set to 50Ω, the capacitance of the capacitive distributed constant circuit 36 is set to 0.05 pF, and the inductance of the conductor 41 is set to 0.4 nH (corresponding to the conductor 41 having a wire length of 0.4 mm). In FIG. 16, a graph G1 is based on the equivalent circuit according to the present embodiment shown in FIG. 12, and a graph G3 is based on the equivalent circuit according to the comparative example shown in FIG. 15. Further, a graph G2 shows a case where the capacitive distributed constant circuit 36 is removed from the equivalent circuit according to the present embodiment.

As shown in the graph G3 of FIG. 16, with the structure according to the comparative example (FIG. 14), when the signal frequency exceeds 34 GHz, the input/output ratio falls below −3 dB. On the other hand, as shown in the graph G1, with the structure according to the present embodiment (FIG. 6 to FIG. 11), the input/output ratio of −3 dB or higher can be maintained until the signal frequency exceeds 45 GHz. As described above, according to the present embodiment, the high-frequency characteristics (for example, S21 characteristics) of the light emitter 11 can be improved, and the light emitter 11 that can receive a high-frequency signal having a frequency of, for example, 50 GHz can be implemented. Note that, as shown in the graph G2, even when the capacitive distributed constant circuit 36 is not provided, the input/output ratio of −3 dB or higher can be maintained until the signal frequency exceeds 39 GHz, allowing the high-frequency characteristics to be improved as compared to the comparative example.

Further, as in the present embodiment, the conductor 41 having an inductor component is disposed on the back surface 33b remote from the EML chip 31, so that the conductor 41 can be disposed without obstructing the disposition of the EML chip 31. In addition, inductor components of the first via 34 and the second via 35 can also contribute to the improvement in high-frequency characteristics.

As in the present embodiment, the conductor 41 may be a wire. As the conductor 41, a wiring pattern made of metal can be used other than a wire. This increases the inductance of the conductor 41 to increase the Q value, and accordingly, the high-frequency characteristics can be more effectively improved.

As in the present embodiment, the capacitive distributed constant circuit 36 may be provided between the signal wiring pattern 33c and the ground pattern 33d. As is clear from the comparison between the graph G1 and the graph G2 in FIG. 16, this makes it possible to further improve the high-frequency characteristics. Further, in this case, in the capacitive distributed constant circuit 36, a capacitive circuit is formed by the stub 36a protruding from the signal wiring pattern 33c and the ground pattern 33d.

The optical module 1 according to the embodiment includes a light emitter 11 (optical modulator carrier assembly). Therefore the optical module 1 is capable of improving high-frequency characteristics.

(First Modification)

Figure 17:
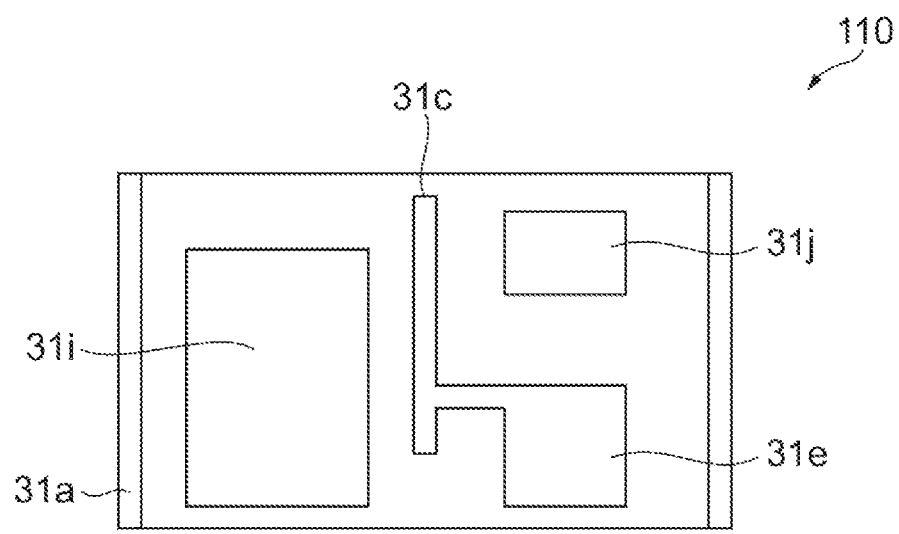
FIG. 17 is a plan view of an optical modulator included in a light emitter according to a first modification.

FIG. 17 is a plan view of an optical modulator 110 included in a light emitter according to a first modification of the above embodiment. The optical modulator 110 according to the present modification has a structure where the laser diode is removed from the EML chip 31 according to the above embodiment. That is, the optical modulator 110 has the anode electrode 31c on the main surface 31a. The main surface 31a is partially covered by an insulating film (for example, silicon nitride). The anode electrode 31c extends along the optical waveguide of the optical modulator 110. The optical modulator 110 further has the electrode pad 31e that is a metal film provided on the main surface 31a. The electrode pad 31e is disposed side by side with the anode electrode 31c along a direction intersecting the optical waveguide of the optical modulator 110 and is electrically connected to the anode electrode 31c. As in the above embodiment, the electrode pad 31e receives a high-frequency modulated signal and inputs the modulated signal to the anode electrode 31c.

The optical modulator 110 further has the electrode pad 31i that is a metal film provided on the main surface 31a. The electrode pad 31i is electrically connected to the cathode electrode of the optical modulator 110. The electrode pad 31i is provided on the main surface 31a such that the anode electrode 31c is interposed between the electrode pads 31e, 31i. In other words, the electrode pads 31e, 31i are arranged side by side along the direction intersecting the optical waveguide of the optical modulator 110, and the anode electrode 31c is disposed between the electrode pads 31e, 31i. The optical modulator 110 further has the metal pad 31j provided on the main surface 31a. The metal pad 31j may or need not be electrically connected to the cathode electrode of the optical modulator 110. The cathode electrode of the optical modulator 110 may or may not be connected to the back electrode. The metal pad 31j is disposed side by side with the electrode pad 31e along the optical waveguide of the optical modulator 110. According to one example, the optical modulator 110 has a thickness of 100 μm, a length of 250 μm along the optical waveguide, and a width of 200 μm along a direction intersecting the optical waveguide.

Figure 18:
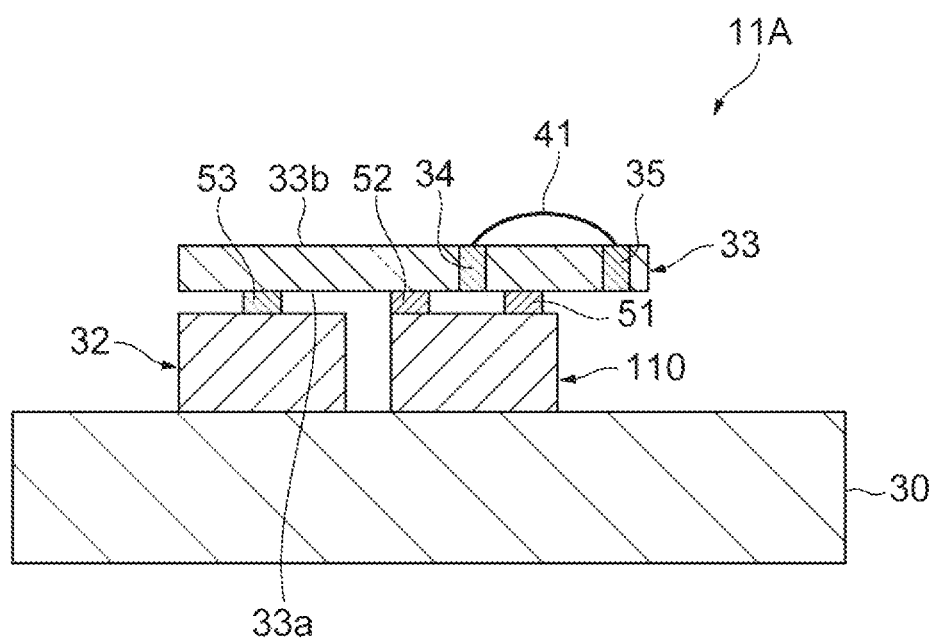
FIG. 18 is a cross-sectional view of a structure of a light emitter according to the first modification, showing cross sections of the optical modulator, transmission members, and a subcarrier along a direction intersecting an optical waveguide of the optical modulator.

FIG. 18 is a cross-sectional view of a structure of a light emitter 11A according to the present modification, showing cross sections of the optical modulator 110, the transmission members 32, 33, and the subcarrier 30 along a direction intersecting the optical waveguide of the optical modulator 110. Note that the structures of the transmission members 32, 33 and the subcarrier 30 are the same as those in the above embodiment except that the metal bump 55 corresponding to the metal pad 31k (see FIG. 5) is not provided.

In the above embodiment and each modification described hereafter, the light emitter (optical modulator carrier assembly) may include the optical modulator 110 instead of the EML chip 31 having a structure where the optical modulator and the laser diode have been modified, as described in this modification. Even such a structure can exhibit the same actions and effects as in the above embodiment. Note that, according to the present modification, a laser diode that inputs continuous wave light to the optical modulator 110 is separately provided behind the optical modulator 110. The optical modulator 110 modulates the laser light output from the laser diode, and the modulated optical signal is output from the optical modulator 110.

(Second Modification)

Figure 19:
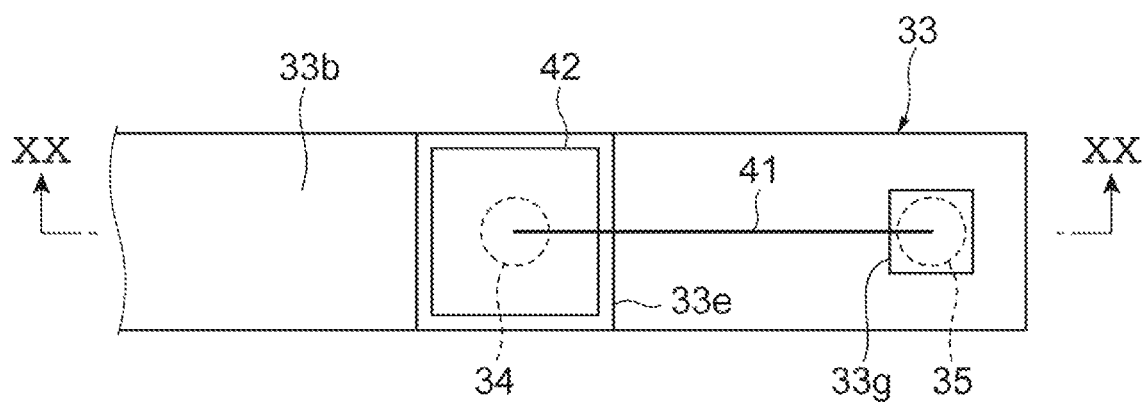
FIG. 19 is a diagram showing a second modification, the diagram being an enlarged view of a portion (back surface) of the transmission member adjacent to the EML chip.
Figure 20:
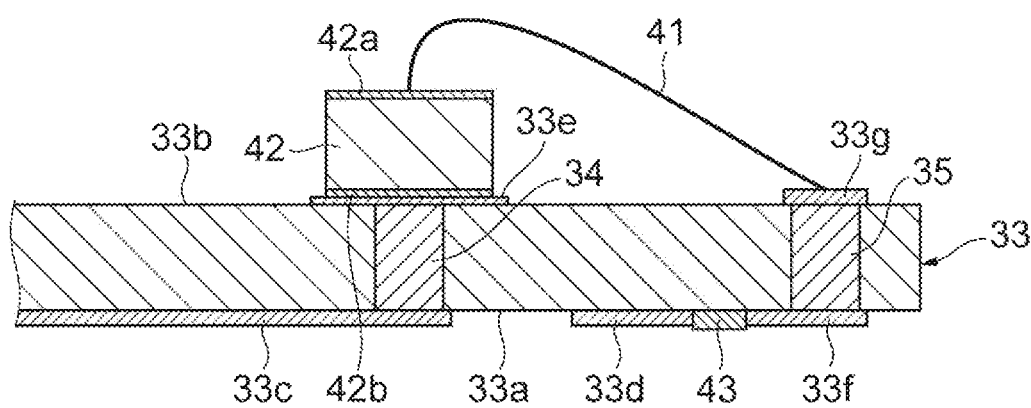
FIG. 20 is a diagram showing the second modification, the diagram being a cross-sectional view along line XX-XX shown in FIG. 19.
Figure 21:
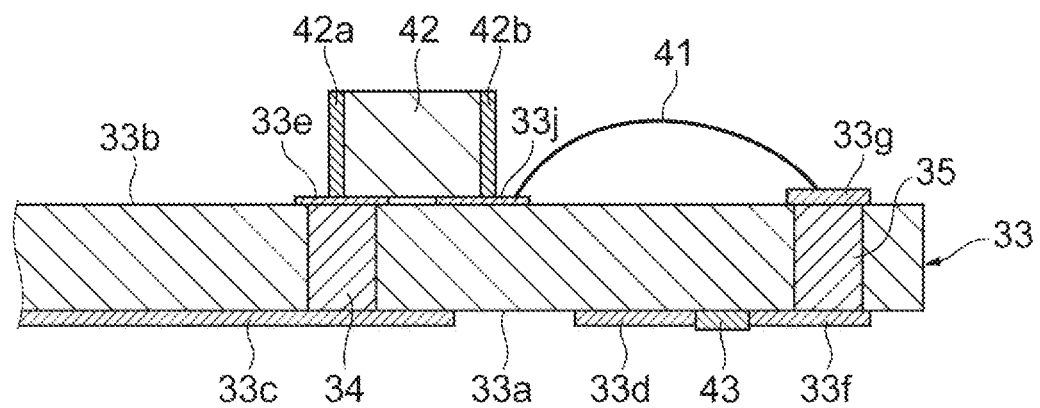
FIG. 21 is a diagram showing the second modification in which a capacitor is of a surface mount device.

FIG. 19, FIG. 20, and FIG. 21 are diagrams showing a second modification of the above embodiment, specifically, enlarged views of a portion of the transmission member adjacent to the EML chip 31. FIG. 19 is a plan view of the back surface 33b, and FIG. 20 is a cross-sectional view taken along line XX-XX shown in FIG. 19. A difference between the present modification and the above embodiment is whether the second capacitor is present. That is, a light emitter (optical modulator carrier assembly) according to the present modification further includes a capacitor 42 (second capacitor) provided on the back surface 33b of the transmission member 33 in the structure according to the above embodiment. The capacitor 42 is connected in series between the other end of the first via 34 on the back surface 33b and the other end of the second via 35 on the back surface 33b. That is, the conductor 41 is connected to one electrode 42a of the capacitor 42, and the other electrode 42b of the capacitor 42 is conductively bonded to the metal pad 33e. Note that the capacitor 42 has a width of 0.38 mm and a length of 0.38 mm, for example.

Figure 22:
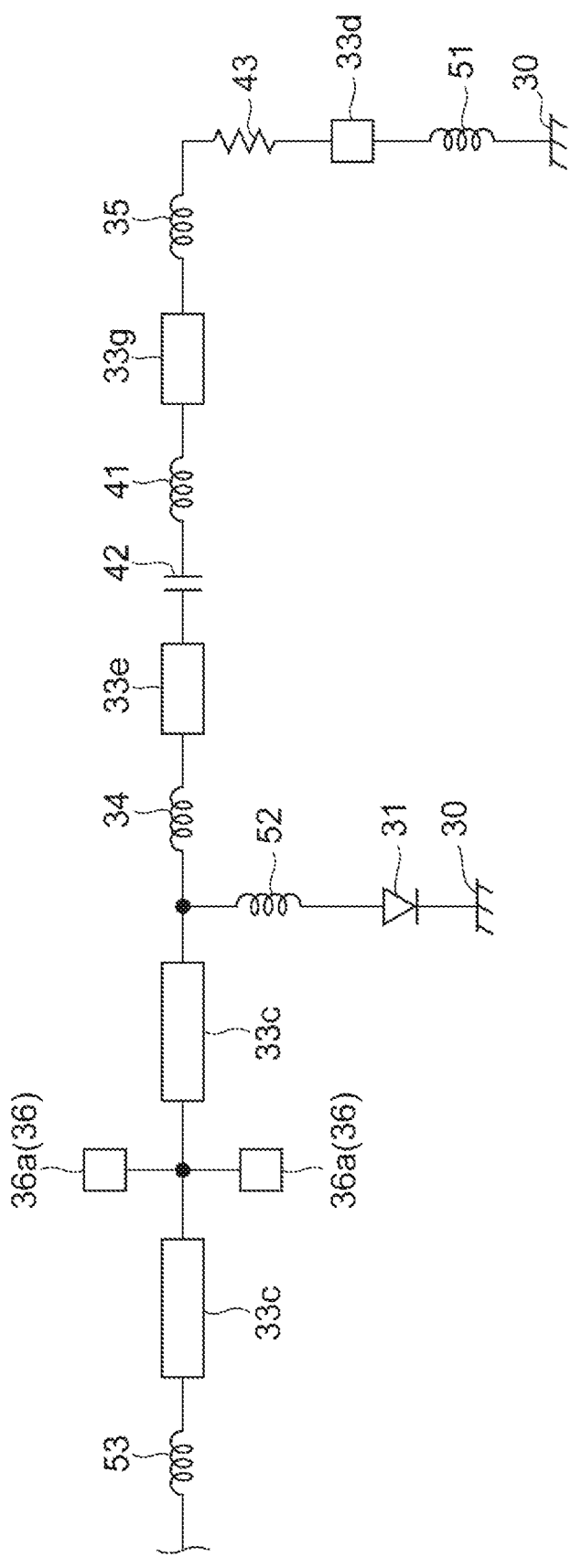
FIG. 22 is a diagram showing an equivalent circuit of the second modification.

To the optical modulator of the EML chip 31, the signal wiring pattern 33c to which the input-side capacitive distributed constant circuits 36 (see FIG. 11) are added is connected via the inductance of the metal bump 52. As shown in FIG. 19 and FIG. 20, the inductance of the conductor 41 and the capacitor 42 are connected between the terminating resistor 43 and the optical modulator of the EML chip 31 via the inductances of the vias 34, 35. The terminating resistor 43 is connected to the cathode electrode of the optical modulator of the EML chip 31 via the inductance of the metal bump 51. The cathode electrode of the optical modulator of the EML chip 31 may or may not be connected to the back electrode. FIG. 19 and FIG. 20 also show the ground pattern 33d and the metal pads 33e, 33g. FIG. 21 is a diagram showing a structure where the capacitor 42 is a multilayer ceramic capacitor of a surface mount device (SMD) type, and the electrodes 42a, 42b are provided on both left and right ends of the capacitor 42. The electrode 42a is conductively bonded to the metal pad 33e, and the electrode 42b is conductively bonded to the metal pad 33j separated from the metal pad 33e. In this structure, the conductor 41 is connected between the metal pad 33j and the metal pad 33g. FIG. 22 is a diagram showing an equivalent circuit according to the present modification. According to the present modification, the capacitor 42 is further connected between the metal pad 33e and the conductor 41 in the equivalent circuit shown in FIG. 12. Note that the capacitor 42 of an SMD type has a width of 0.2 mm and a length of 0.4 mm, for example.

As in the present modification, the light emitter (optical modulator carrier assembly) may further include the capacitor 42. In this structure, a current flowing through the ground pattern 33d via the inductor component of the conductor 41 and the terminating resistor 43 can be suppressed by the capacitor 42, so that power consumption can be reduced.

(Third Modification)

Figure 23:
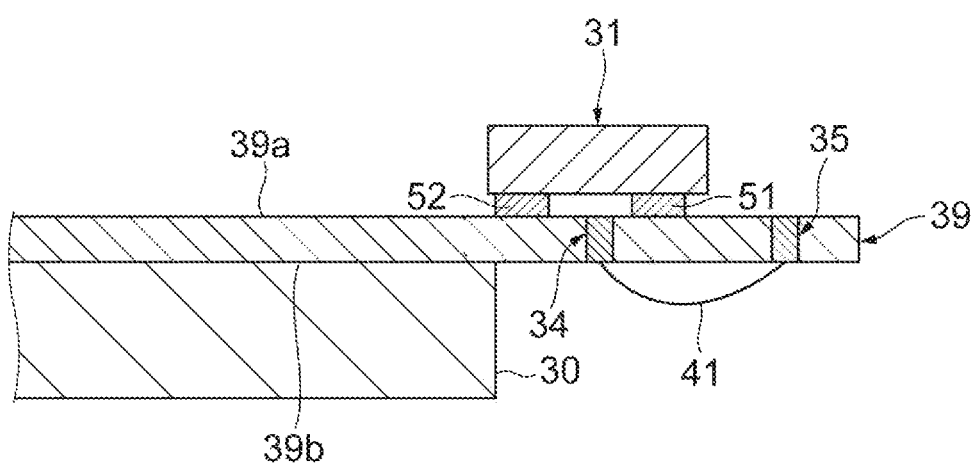
FIG. 23 is a diagram showing a third modification, specifically showing cross sections of the EML chip, a transmission member, and the subcarrier along a lateral axis of the EML chip.
Figure 24:
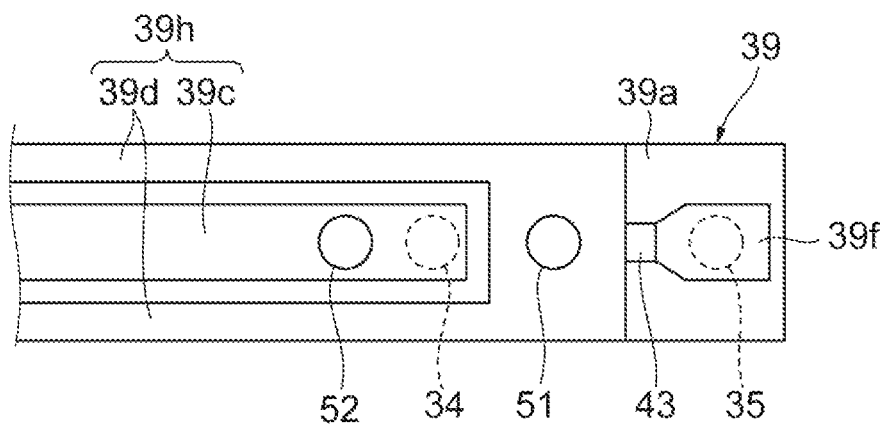
FIG. 24 is a diagram showing the third modification, specifically showing a main surface of a transmission member.
Figure 25:
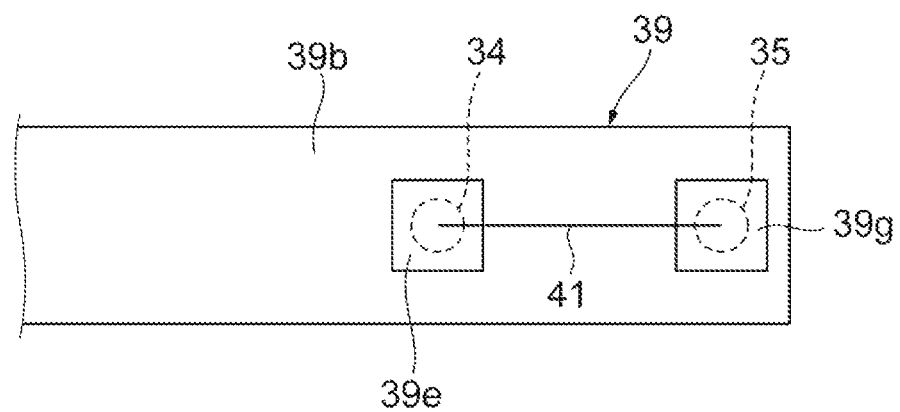
FIG. 25 is a diagram showing the third modification, specifically showing a back surface of the transmission member.

FIG. 23, FIG. 24, and FIG. 25 are diagrams showing a third modification of the above embodiment, specifically, enlarged views of a portion of a transmission member adjacent to the EML chip 31. FIG. 23 shows cross sections of the EML chip 31, a transmission member 39, and the subcarrier 30 along the lateral axis of the EML chip 31. FIG. 24 shows a main surface 39a of the transmission member 39, and FIG. 25 shows a back surface 39b of the transmission member 39. The light emitter 11 according to the above embodiment may include the transmission member 39 according to the present modification instead of the transmission members 32, 33.

The transmission member 39 is a wiring substrate extending along the lateral axis of the EML chip 31 and has the main surface 39a, and the back surface 39b on the opposite side of the EML chip 31 from the main surface 39a. The back surface 39b is partially opposed to the subcarrier 30, and the EML chip 31 is flip-chip mounted on the main surface 39a. That is, the main surface 31a of the EML chip 31 is opposed to the main surface 39a, and the electrode pads 31e, 31i of the EML chip 31 are conductively bonded to a wiring pattern on the main surface 39a. Note that when viewed along a normal line of the main surface 39a, the EML chip 31 is disposed on the main surface 39a so as not to overlap the subcarrier 30.

Specifically, as shown in FIG. 24, a signal wiring pattern 39c and a ground pattern 39d that are conductive metal films are provided on the main surface 39a of the transmission member 39. The signal wiring pattern 39c extends along the lateral axis of the EML chip 31 on the main surface 39a, from a region opposed to the EML chip 31 to a region over the subcarrier 30. The ground pattern 39d is provided to surround the signal wiring pattern 39c, and a certain gap is provided between the ground pattern 39d and the signal wiring pattern 39c. The signal wiring pattern 39c and the ground pattern 39d form a coplanar line 39h that is a transmission line.

The metal bump 52 is provided on the signal wiring pattern 39c. The metal bump 52 is disposed, on one side of the signal wiring pattern 39c, adjacent to the EML chip 31. The metal bump 52 is sandwiched between the signal wiring pattern 39c of the transmission member 39 and the electrode pad 31e of the EML chip 31 (see FIG. 5), and the signal wiring pattern 39c and the electrode pad 31e are conductively bonded to each other via the metal bump 52. Further, the metal bump 51 is provided on the ground pattern 39d. The metal bump 51 is disposed, on one side of the ground pattern 39d, adjacent to the EML chip 31. The metal bump 51 is sandwiched between the ground pattern 39d of the transmission member 39 and the electrode pad 31i of the EML chip 31 (see FIG. 5), and the ground pattern 39d and the electrode pad 31i are conductively bonded to each other via the metal bump 51. Note that the conductive bonding is achieved by not only such a metal bump, but also solder, for example. The other end of the signal wiring pattern 39c is electrically connected to the signal line 23 shown in FIG. 2, for example, in the same manner as the wire 72 shown in FIG. 4.

The transmission member 39, as with the transmission member 33 according to the above embodiment, further has the conductive first via 34 and second via 35 provided extending through from the main surface 39a and the back surface 39b. When viewed along a thickness of the transmission member 39, the first via 34 and the second via 35 are provided so as not to overlap the subcarrier 30.

The first via 34 is provided, on one side of the signal wiring pattern 39c, at a position overlapping the signal wiring pattern 39c when viewed along the thickness of the transmission member 39. According to the present modification, the first via 34 is located adjacent to the one side relative to the metal bump 52 along a direction of extension of the signal wiring pattern 39c. Therefore, a conduction distance from the other side of the signal wiring pattern 39c to the first via 34 is longer than a conduction distance from the other side of the signal wiring pattern 39c to the metal bump 52. One end of the first via 34 on the main surface 39a is electrically connected (for example, in contact) with the signal wiring pattern 39c. The other end of the first via 34 on the back surface 39b is electrically connected (for example, in contact) with a metal pad 39e that is a conductive metal film provided on the back surface 39b.

The second via 35 is provided outside the ground pattern 39d when viewed along the thickness of the transmission member 39. One end of the second via 35 on the main surface 39a is electrically connected (for example, in contact) with a metal pad 39f that is a conductive metal film provided on the main surface 39a. The other end of the second via 35 on the back surface 39b is electrically connected (for example, in contact) with a metal pad 39g that is a conductive metal film provided on the back surface 39b. According to the present modification, the second via 35 is also disposed side by side with the first via 34 along the direction of extension of the signal wiring pattern 39c. The transmission member 39 has the terminating resistor 43 for impedance matching on the back surface 39b. The terminating resistor 43 is located between the metal pad 39f and the ground pattern 39d, and the metal pad 39f and the ground pattern 39d are electrically connected to each other via the terminating resistor 43. That is, one end of the second via 35 on the main surface 39a is electrically connected to the ground pattern 39d via the terminating resistor 43.

The transmission member 39 further has the elongated conductor 41 provided on the back surface 39b. The conductor 41 has an inductor component and electrically connects the other end of the first via 34 on the back surface 39b with the other end of the second via 35 on the back surface 39b. In one example, the conductor 41 is a wire. Alternatively, the conductor 41 may be a lumped constant line or a combination of a wire and a lumped constant line. When viewed along a normal line of the back surface 39b, the conductor 41 is disposed so as not to overlap the subcarrier 30. Specifically, one end of the conductor 41 is connected to the metal pad 39e, and the other end of the conductor 41 is connected to the metal pad 39g. When the conductor 41 is a wire, the conductor 41 has a length of, for example, 0.4 to 0.8 mm.

Note that, according to the present modification, the transmission member 39 may have a capacitor corresponding to the capacitive distributed constant circuit 36 according to the above embodiment between the signal wiring pattern 39c and the ground pattern 39d. In such a structure, the equivalent circuit is the same as in the above embodiment (see FIG. 12).

According to the present modification, the signal wiring pattern 39c transmits a high-frequency modulated signal to the electrode pad 31e of the optical modulator. This brings the optical modulator of the EML chip 31 into operation to modulate the laser light output from the laser diode of the EML chip 31. Then, the modulated optical signal is output from the EML chip 31.

Figure 26:
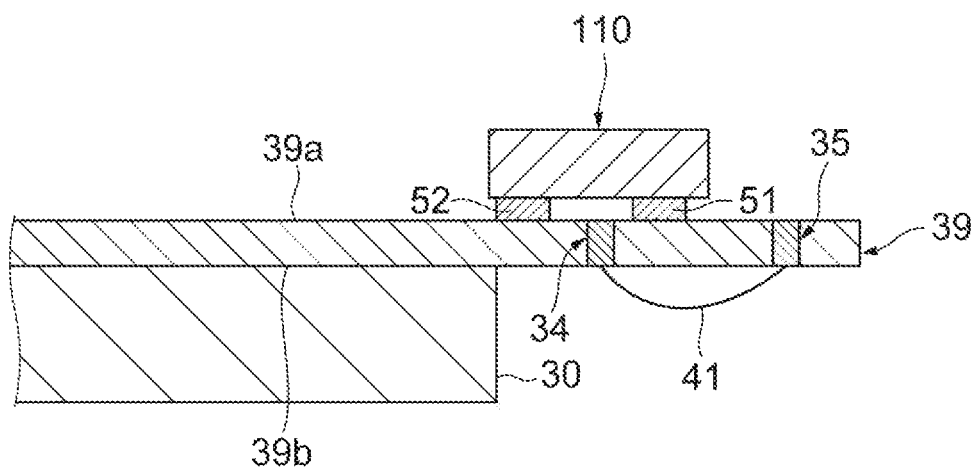
FIG. 26 is a diagram showing an aspect in which the optical modulator shown in the first modification is mounted on the main surface instead of the EML chip.

As in the present modification, the main surface 39a of the transmission member 39 may be disposed remote from the subcarrier 30, and the EML chip 31 may be flip-chip mounted on the main surface 39a. Then, the conductor 41 may be disposed on the same side as the subcarrier 30. Even such a structure can exhibit the same effects as in the above embodiment. Note that, as shown in FIG. 26, instead of the EML chip 31, the optical modulator 110 shown in the first modification may be mounted on the main surface 39a. Even such a structure can exhibit the same effects as in the above embodiment.

(Fourth Modification)

Figure 27:
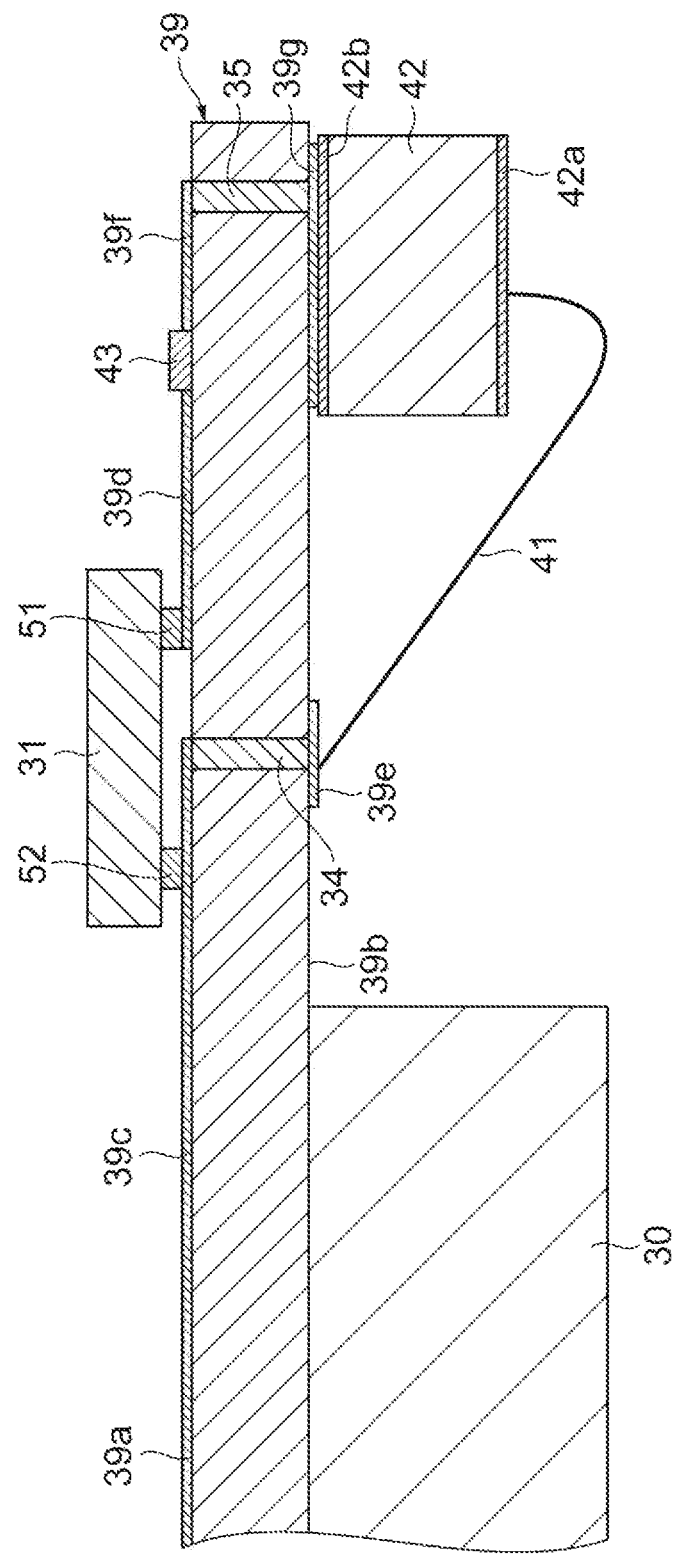
FIG. 27 is a cross-sectional view of a fourth modification, showing an enlarged view of a portion of the transmission member adjacent to the EML chip.

FIG. 27 is a diagram showing a fourth modification of the above embodiment, specifically, an enlarged view of a portion of a transmission member adjacent to the EML chip 31 and cross-sectional views of the EML chip 31, the transmission member 39, and the subcarrier 30 along the lateral axis of the EML chip 31. A difference between the present modification and the above third modification is whether the second capacitor is present. That is, a light emitter (optical modulator carrier assembly) according to the present modification further includes the capacitor 42 (second capacitor) provided on the back surface 39b of the transmission member 39 in the structure according to the above third modification. The capacitor 42 is connected in series between the other end of the first via 34 on the back surface 39b and the other end of the second via 35 on the back surface 39b. That is, the conductor 41 is connected to one electrode 42a of the capacitor 42, and the other electrode 42b of the capacitor 42 is conductively bonded to the metal pad 39g.

Figure 28:
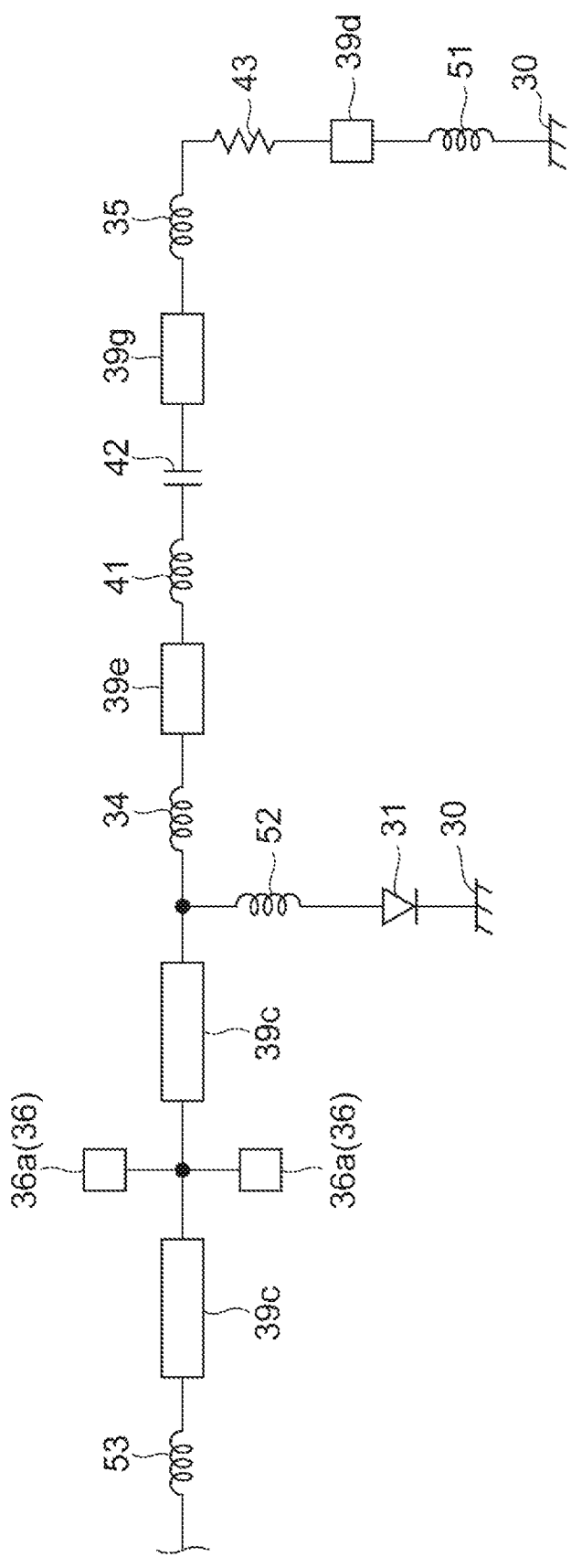
FIG. 28 is a diagram showing an equivalent circuit of the fourth modification.

The signal wiring pattern 39c to which the input-side capacitive distributed constant circuits 36 (see FIG. 11) are added is connected to the EML chip 31 via the inductance of the metal bump 52. The inductance of the conductor 41 and the capacitor 42 are connected in series between the terminating resistor 43 and the optical modulator of the EML chip 31 via the inductances of the vias 34, 35. The terminating resistor 43 is connected to the cathode electrode of the optical modulator of the EMI chip 31 via the inductance of the metal bump 51. The cathode electrode of the optical modulator of the EML chip 31 may or may not be connected to the back electrode. FIG. 28 is a diagram showing an equivalent circuit according to the present modification. According to the present modification, the capacitor 42 is connected between the conductor 41 and the metal pad 39g in addition to the equivalent circuit shown in FIG. 12.

Figure 29:
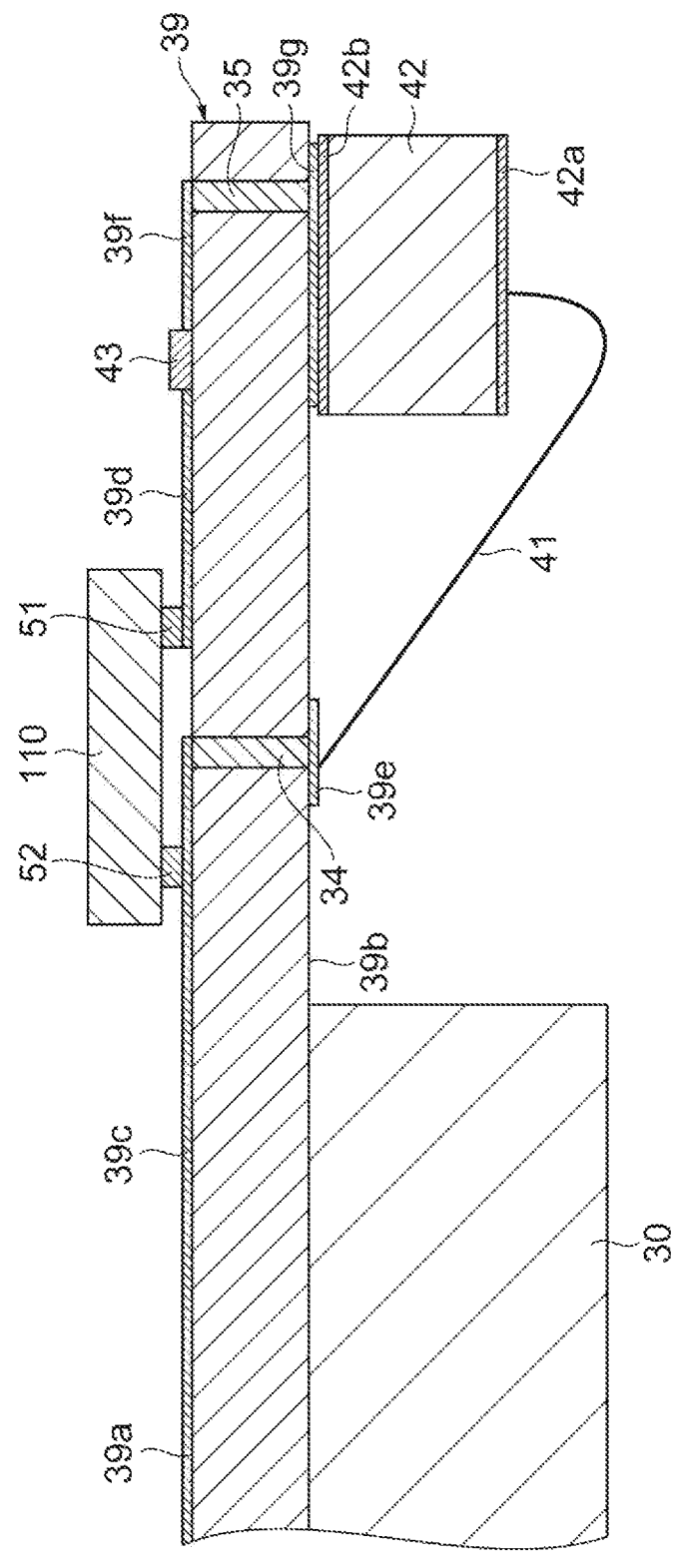
FIG. 29 is a diagram showing an aspect in which the optical modulator shown in the first modification is mounted on the main surface instead of the EML chip.

According to the present modification, as in the second modification, a current flowing through the ground pattern 39d via the inductor component of the conductor 41 and the terminating resistor 43 can be suppressed by the capacitor 42, so that power consumption can be reduced. Note that, as shown in FIG. 29, instead of the EML chip 31, the optical modulator 110 shown in the first modification may be mounted on the main surface 39a. Even such a structure can suitably exhibit the effects of the present modification.

Figure 30:
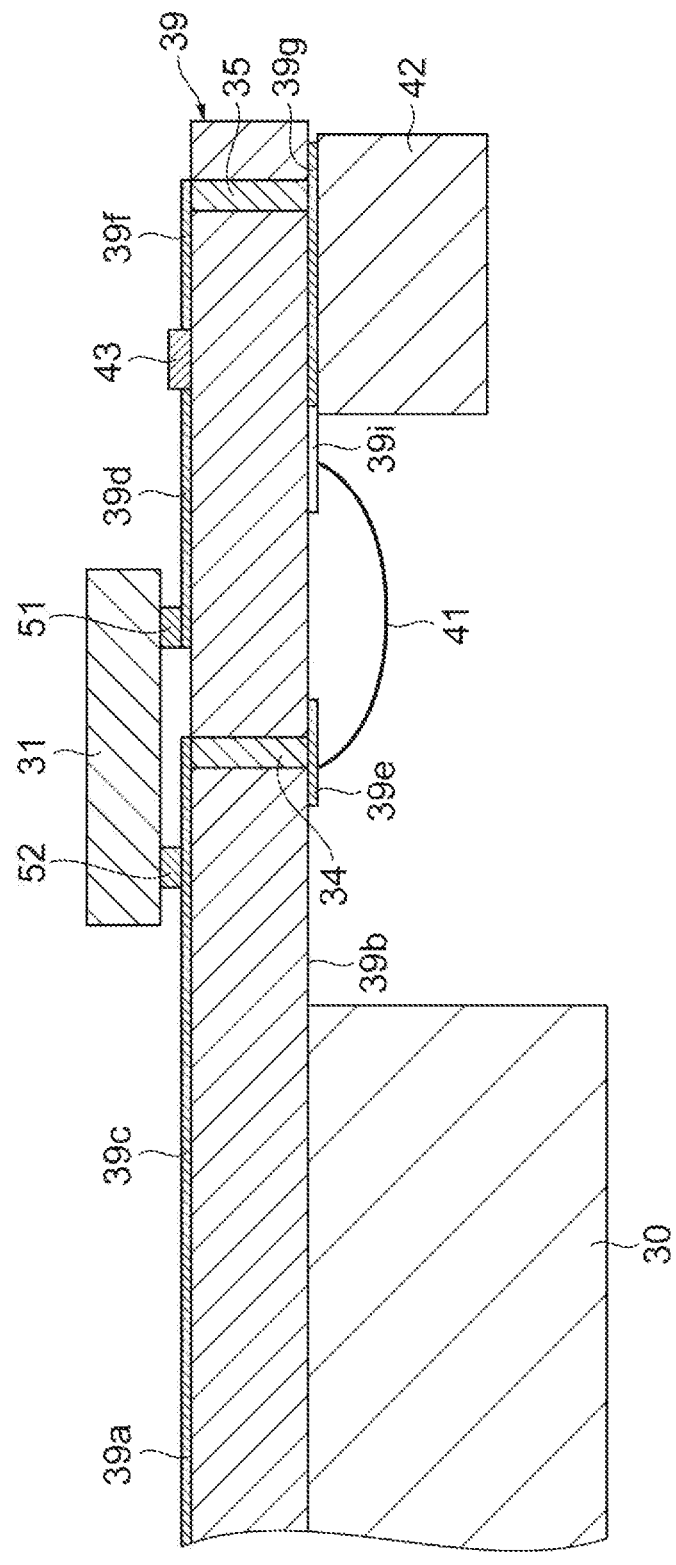
FIG. 30 is a cross-sectional view of a structure where the capacitor is of a surface mount device.
Figure 31:
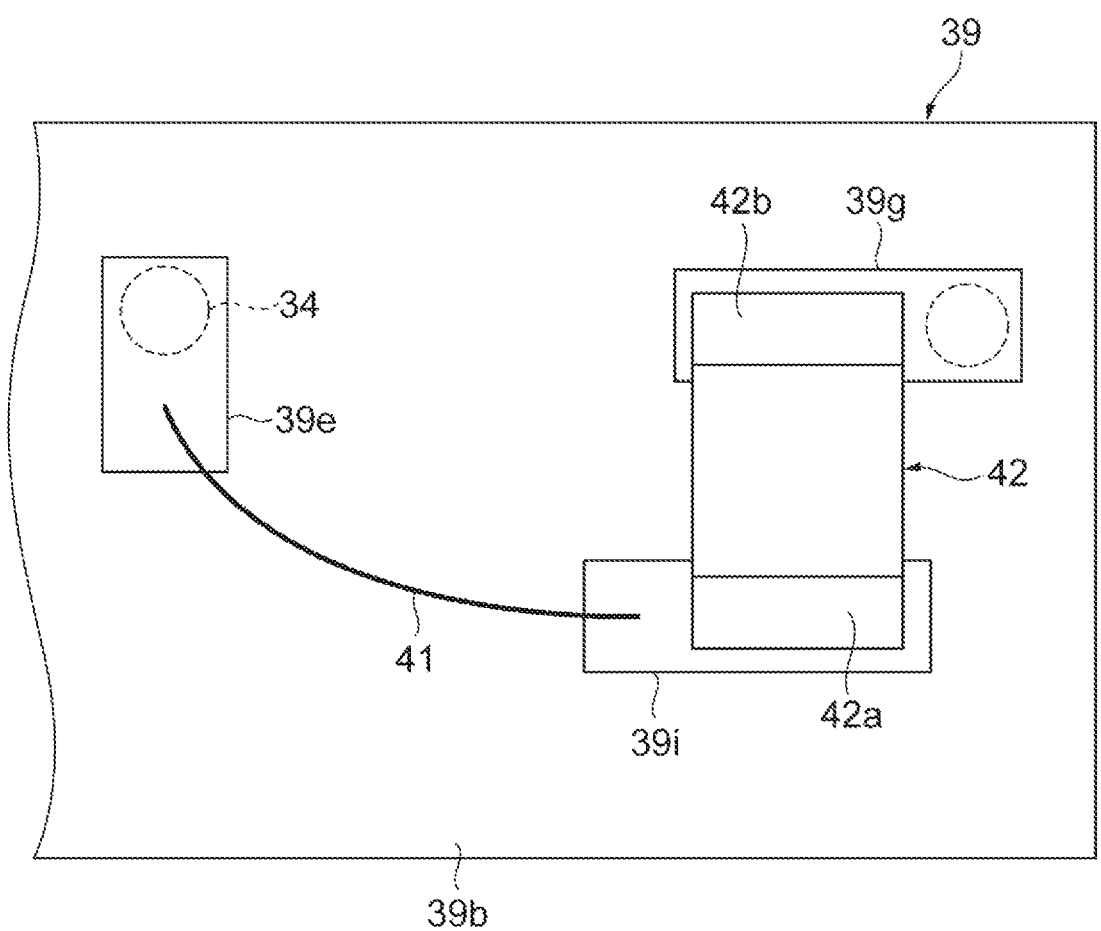
FIG. 31 is an enlarged view of a portion of the transmission member adjacent to the capacitor, showing the back surface of the transmission member.
Figure 32:
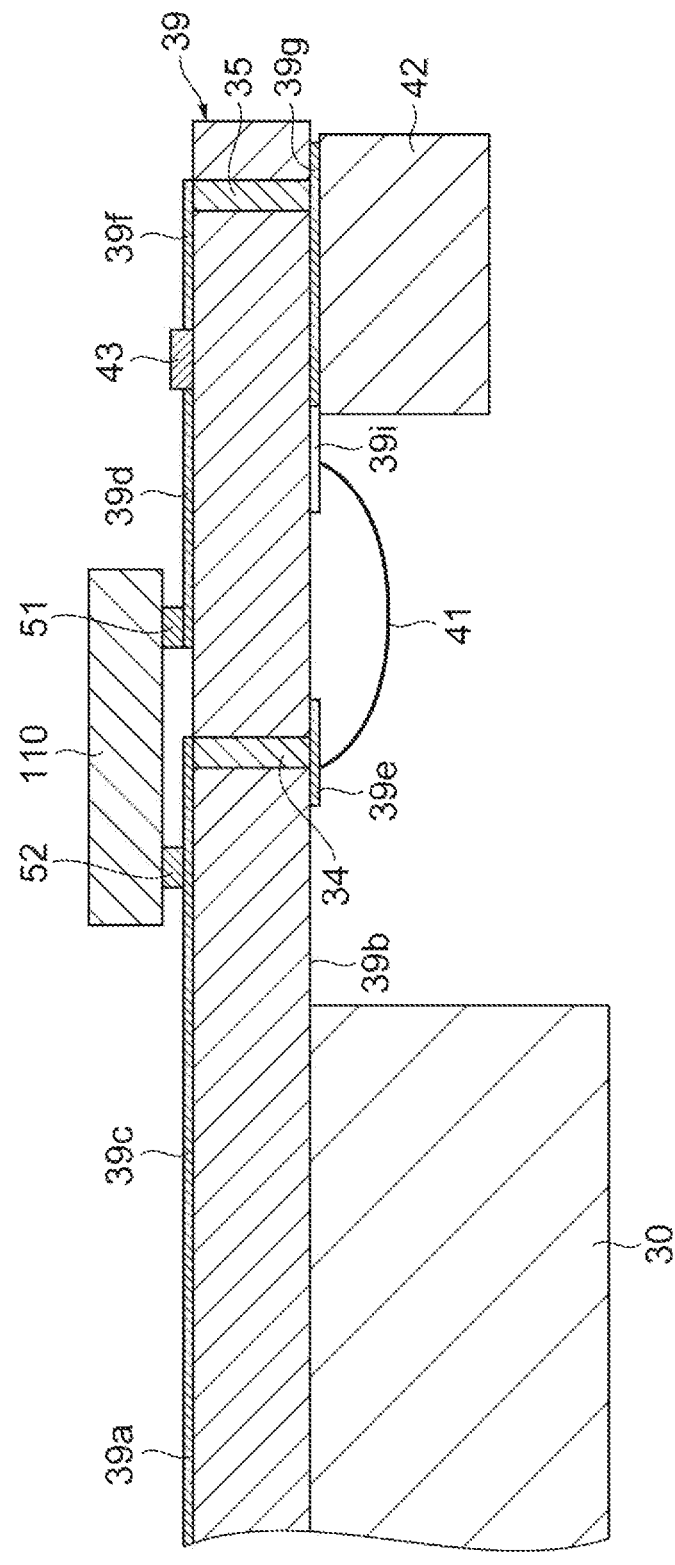
FIG. 32 is a diagram showing an aspect in which the optical modulator shown in the first modification is mounted on the main surface instead of the EML chip.

Further, according to the present modification, the capacitor 42 may be a multilayer ceramic capacitor of a surface mount device (SMD) type. FIG. 30 shows a cross section of a structure where the capacitor 42 is of a surface mount device type. FIG. 31 is an enlarged view of a portion of the transmission member 39 adjacent to the capacitor 42, showing the back surface 39b of the transmission member 39. In this example, the electrodes 42a, 42b are provided on both left and right ends of the capacitor 42. The electrode 42a is conductively bonded to a metal pad 39i provided on the back surface 39b, and the electrode 42b is conductively bonded to the metal pad 39g separated from the metal pad 39i. In this structure, the conductor 41 is connected between the metal pad 39i and the metal pad 39e. Even such a structure can suitably exhibit the effects of the present modification. Further, in this example, as shown in FIG. 32, instead of EML chip 31, the optical modulator 110 shown in the first modification may be mounted on main surface 39a. Even such a structure can suitably exhibit the effects of the present modification.

What is claimed is:

1. An optical modulator assembly comprising:
    an optical modulator having one surface, an anode electrode pad and a cathode electrode pad, the anode electrode pad and the cathode electrode pad are formed on the one surface;
    a transmission line substrate having a first surface faces with the one surface of the optical modulator and a second surface opposed to the first surface, a signal wiring pattern provided on the first surface and electrically connected with the anode electrode pad, a ground pattern provided on the first surface and electrically connected with the cathode electrode pad and a terminating resistor provided on the first surface;
    a first via provided extending through from the first surface to the second surface of the transmission line substrate, the first via having one end on the first surface electrically connected to the signal wiring pattern and another end on the second surface;
    a second via provided extending through from the first surface to the second surface of the transmission line substrate, the second via having one end on the first surface electrically connected to the ground pattern via the terminating resistor and another end on the second surface;
    and a wire having an inductor component provided on the second surface of the transmission line substrate, and electrically connecting between the another end of the first via and the another end of the second via; and
    the one end of the first via, the cathode electrode pad, the terminating resistor, and the one end of the second via are arranged on the first surface of the transmission line substrate.

2. The optical modulator assembly according to claim 1, further comprising a first capacitor provided between the signal wiring pattern and the ground pattern.

3. The optical modulator assembly according to claim 2, wherein the first capacitor includes a wiring pattern protruding from the signal wiring pattern and extending along the ground pattern.

4. The optical modulator assembly according to claim 1, further comprising a second capacitor provided on the second surface and connected in series between the other end of the first via on the second surface and the other end of the second via on the second surface.

5. The optical modulator assembly according to claim 1, wherein the optical modulator is integrated with a semiconductor laser.

6. An optical module comprising the optical modulator assembly according to claim 1, and a housing to house the optical modulator assembly.

7. An optical modulator assembly comprising:
an optical modulator having one surface, an anode electrode pad and a cathode electrode pad, the anode electrode pad and the cathode electrode pad are formed on the one surface;
a transmission line substrate having a first surface faces with the one surface of the optical modulator and a second surface opposed to the first surface, a signal wiring pattern provided on the first surface and electrically connected with the anode electrode pad, a ground pattern provided on the first surface and electrically connected with the cathode electrode pad and terminating resistor provided on the first surface;
a terminating resistor provided on the first surface and connected with the ground pattern;
a via provided through the first surface to the second surface of the transmission line substrate; and
a wire having an inductor component provided on the second surface, a first end of the wire electrically connecting the via, and a second end of the wiring electrically connecting the terminating resistor.

8. The optical modulator assembly according to claim 7, further comprising:
a first capacitor provided between the signal wiring pattern and the ground pattern and located between the anode electrode pad and a signal input,
wherein the first capacitor protrudes from the signal wiring pattern to the ground pattern.

9. The optical modulator assembly according to claim 8, wherein a one end of the first capacitor is extending along the ground pattern.

* * * * *